(12) United States Patent
Horii et al.

(10) Patent No.: US 9,728,607 B2
(45) Date of Patent: Aug. 8, 2017

(54) SILICON CARBIDE SEMICONDUCTOR DEVICE AND METHOD FOR MANUFACTURING SILICON CARBIDE SEMICONDUCTOR DEVICE

(71) Applicant: Sumitomo Electric Industries, Ltd., Osaka-shi (JP)

(72) Inventors: Taku Horii, Osaka (JP); Masaki Kijima, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/766,955

(22) PCT Filed: Jan. 17, 2014

(86) PCT No.: PCT/JP2014/050798
§ 371 (c)(1),
(2) Date: Aug. 10, 2015

(87) PCT Pub. No.: WO2014/136478
PCT Pub. Date: Sep. 12, 2014

(65) Prior Publication Data
US 2015/0372094 A1    Dec. 24, 2015

(30) Foreign Application Priority Data
Mar. 8, 2013 (JP) .................................. 2013-046894

(51) Int. Cl.
*H01L 29/16* (2006.01)
*H01L 23/528* (2006.01)
(Continued)

(52) U.S. Cl.
CPC .... *H01L 29/1608* (2013.01); *H01L 21/02164* (2013.01); *H01L 21/048* (2013.01);
(Continued)

(58) Field of Classification Search
None
See application file for complete search history.

(56) References Cited

U.S. PATENT DOCUMENTS 4,372,034 A * 2/1983 Bohr ................. H01L 21/31111
257/E21.251
5,006,913 A * 4/1991 Sugahara ............ H01L 27/0688
257/67
(Continued)

FOREIGN PATENT DOCUMENTS

CN    101174569 A    5/2008
CN    101842878 A    9/2010
(Continued)

OTHER PUBLICATIONS

International Search Report in PCT International Application No. PCT/JP2014/050798, dated Mar. 25, 2014.
(Continued)

*Primary Examiner* — Michael Lebentritt
*Assistant Examiner* — Jordan Klein
(74) *Attorney, Agent, or Firm* — Venable LLP; Michael A. Sartori; Laura G. Remus

(57) ABSTRACT

A silicon carbide substrate having a gate insulating film provided in contact with a first main surface, having a gate electrode provided in contact with the gate insulating film, and having a source region exposed from first main surface is prepared. A first recess having a first inner wall surface is formed in an interlayer insulating film by performing a first isotropic etching with respect to the interlayer insulating film with use of a mask layer. A second recess having a second inner wall surface is formed by performing a first anisotropic etching with respect to the interlayer insulating film and the gate insulating film with use of the mask layer and thereby exposing the source region from gate insulating film. An interconnection is formed which is arranged in
(Continued)

contact with the first inner wall surface and the second inner wall surface and electrically connected to a source electrode.

16 Claims, 18 Drawing Sheets

(51) Int. Cl.
  *H01L 21/768* (2006.01)
  *H01L 21/28* (2006.01)
  *H01L 29/78* (2006.01)
  *H01L 29/66* (2006.01)
  *H01L 21/02* (2006.01)
  *H01L 21/04* (2006.01)
  *H01L 21/311* (2006.01)
  *H01L 23/532* (2006.01)

(52) U.S. Cl.
  CPC ........ *H01L 21/28* (2013.01); *H01L 21/31111* (2013.01); *H01L 21/31116* (2013.01); *H01L 21/31144* (2013.01); *H01L 21/76802* (2013.01); *H01L 21/76804* (2013.01); *H01L 21/76844* (2013.01); *H01L 21/76877* (2013.01); *H01L 23/528* (2013.01); *H01L 23/5329* (2013.01); *H01L 23/53266* (2013.01); *H01L 29/66068* (2013.01); *H01L 29/78* (2013.01); *H01L 2924/0002* (2013.01)

(56) References Cited

U.S. PATENT DOCUMENTS

| | | | | |
|---|---|---|---|---|
| 5,077,238 A * | 12/1991 | Fujii | ................. | H01L 21/31055 |
| | | | | 148/DIG. 133 |
| 5,483,483 A * | 1/1996 | Choi | ................. | G11C 7/12 |
| | | | | 257/378 |
| 5,518,962 A * | 5/1996 | Murao | ................. | H01L 21/02129 |
| | | | | 257/E21.241 |
| 5,710,070 A * | 1/1998 | Chan | ................. | B41J 2/14072 |
| | | | | 347/59 |
| 2003/0107041 A1* | 6/2003 | Tanimoto | ................. | H01L 29/66068 |
| | | | | 257/77 |
| 2004/0183080 A1* | 9/2004 | Kusumoto | ................. | H01L 21/0485 |
| | | | | 257/77 |
| 2006/0027833 A1* | 2/2006 | Tanimoto | ................. | H01L 21/0485 |
| | | | | 257/173 |
| 2008/0102585 A1* | 5/2008 | Nakamura | ................. | H01L 21/049 |
| | | | | 438/285 |
| 2010/0207125 A1* | 8/2010 | Uchida | ................. | H01L 21/0485 |
| | | | | 257/77 |
| 2010/0248483 A1* | 9/2010 | Orita | ................. | H01L 21/31111 |
| | | | | 438/700 |
| 2012/0056201 A1 | 3/2012 | Wada et al. | | |

FOREIGN PATENT DOCUMENTS

| | | |
|---|---|---|
| CN | 102422425 A | 4/2012 |
| JP | 10-321732 A | 12/1998 |
| JP | 2002-026322 A | 1/2002 |
| JP | 2003-318129 A | 11/2003 |
| JP | 2006-173289 A | 6/2006 |
| JP | 2007-059954 A | 3/2007 |
| JP | 2008-112824 A | 5/2008 |
| JP | 2010-141028 A | 6/2010 |
| JP | 2010-147380 A | 7/2010 |
| JP | 2011-129750 A | 6/2011 |

OTHER PUBLICATIONS

Matsunami et al., "Semiconductor SiC Technology and Applications, the Second Edition," Nikkan Kogyo Shimbun, Ltd., Sep. 30, 2011, pp. 358 to 365.

Extended European Search Report in counterpart European Patent Application No. 14761228.7, dated Sep. 14, 2016.

Notice of Grounds of Rejection in counterpart Japanese Patent Application No. 2013-046894, dated Feb. 7, 2017.

* cited by examiner

SILICON CARBIDE SEMICONDUCTOR DEVICE AND METHOD FOR MANUFACTURING SILICON CARBIDE SEMICONDUCTOR DEVICE

TECHNICAL FIELD

The present invention relates to a silicon carbide semiconductor device and a method for manufacturing the silicon carbide semiconductor device, and more particularly to a silicon carbide semiconductor device capable of improving a reliability of an interconnection and a method for manufacturing such a silicon carbide semiconductor device.

BACKGROUND ART

In recent years, in order to achieve a higher breakdown voltage, a lower loss, and a use under a high temperature environment for a semiconductor device such as a MOSFET (Metal Oxide Semiconductor Field Effect Transistor), silicon carbide is employed increasingly as a material constituting the semiconductor device. Silicon carbide is a wide band gap semiconductor having a band gap larger than that of silicon, which has been conventionally and widely used as a material for semiconductor devices. Hence, by adopting silicon carbide as a material for a semiconductor device, the semiconductor device can have a high reverse breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

For example, "Semiconductor SiC Technology and Applications, the Second Edition" by Hiroyuki Matsunami and other three persons., Nikkan Kogyo Shimbun, Ltd., Sep. 30, 2011, p 358 to 365 (NPD 1) discloses a planar MOSFET including an insulating film, which is arranged so as to surround a gate electrode, and a source electrode interconnection, which is provided in contact with the insulating film and electrically connected to an $n^+$ region.

CITATION LIST

Non Patent Document

NPD 1: "Semiconductor SiC Technology and Applications, the Second Edition" by Hiroyuki Matsunami and other three persons., Nikkan Kogyo Shimbun, Ltd., Sep. 30, 2011, p 358 to 365

SUMMARY OF INVENTION

Technical Problem

A MOSFET made of silicon carbide allows a larger current to flow as compared to a MOSFET made of silicon. Therefore, a source electrode interconnection of a silicon carbide MOSFET is often designed to be thicker than a source electrode interconnection of a silicon MOSFET. For example, while the thickness of an interconnection of a silicon MOSFET is about less than 2 µm, the thickness of an interconnection of a silicon carbide MOSFET is about greater than or equal to 2 µm. According to the MOSFET disclosed in the above-described document, the insulating film is formed along the shape of the gate insulating film. Therefore, a corner portion is formed in the insulating film at a part surrounding the outer circumferential corner portion of the gate electrode. When a thick source electrode interconnection is formed along the corner portion of the insulating film, a cavity (so-called "void") is formed inside the interconnection formed near the corner portion of the insulating film. If the cavity is formed inside the interconnection, the interconnection may be broken when a large current flows through the interconnection. Therefore, the reliability of the interconnection (in other words, electromigration resistance) is lowered.

The present invention was made in view of the problem described above, and its object is to provide a silicon carbide semiconductor device capable of improving the reliability of an interconnection and a method for manufacturing the silicon carbide semiconductor device.

Solution to Problem

A method for manufacturing a silicon carbide semiconductor device according to the present invention includes the following steps. A silicon carbide substrate is prepared which has a first main surface and a second main surface opposite to each other, has a gate insulating film provided in contact with the first main surface, has a gate electrode provided in contact with the gate insulating film, and includes a first conductivity type region in contact with the first main surface. An interlayer insulating film is formed which is in contact with the gate electrode and the gate insulating film. A mask layer is formed in contact with the interlayer insulating film. A first recess having a first inner wall surface is formed in the interlayer insulating film by performing a first isotropic etching with respect to the interlayer insulating film with use of the mask layer. After the step of forming a first recess, a second recess having a second inner wall surface is formed by performing a first anisotropic etching with respect to the interlayer insulating film and the gate insulating film with use of the mask layer and thereby exposing the first conductivity type region of the silicon carbide substrate. A first electrode is formed in contact with the first conductivity type region. An interconnection is formed which is arranged in contact with the first inner wall surface of the first recess and the second inner wall surface of the second recess and electrically connected to the first electrode.

According to the silicon carbide semiconductor device of the present invention, after the first recess is formed in the interlayer insulating film by performing the isotropic etching, the second recess is formed by performing the anisotropic etching and thereby exposing the first conductivity type region from the gate insulating film. The interconnection is formed which is arranged in contact with the first inner wall surface and the second inner wall surface and connected to the first electrode. By the isotropic etching, the firs recess is formed which has the first inner wall surface having a roundness in the interlayer insulating film. Since the interconnection is arranged in contact with the first inner wall surface, formation of the cavity inside the interconnection can be suppressed. Consequently, since the breaking of the interconnection can be suppressed when a large current flows through the interconnection, the reliability of the interconnection can be improved.

Preferably, in the above-described method for manufacturing a silicon carbide semiconductor device, the step of forming an interlayer insulating film includes the step of reducing a level difference in an upper surface of the interlayer insulating film by heating the interlayer insulating film. Accordingly, since the interconnection is formed on the interlayer insulating film having a reduced level difference in the upper surface, generation of the cavity inside the interconnection can be suppressed efficiently.

Preferably, in the above-described method for manufacturing a silicon carbide semiconductor device, the step of forming an interlayer insulating film includes the step of forming a first insulating film being in contact with the gate electrode and not being doped with impurities and the step of forming a second insulating film covering the first insulating film, having a lower softening point than the first insulating film, and being doped with impurities. Accordingly, the level difference in the upper surface of the interlayer insulating film can be reduced at a low temperature. Moreover, since the first insulating film is not doped with impurities, impurities such as phosphorus are diffused at the interface between the gate insulating film and the silicon carbide substrate, so that a variation in the threshold voltage of the gate voltage can be suppressed.

Preferably, in the above-described method for manufacturing a silicon carbide semiconductor device, the step of forming an interlayer insulating film further includes the step of forming a third insulating film covering the second insulating film and being constituted of silicon dioxide. The third insulating film constituted of silicon dioxide has a good adhesion with the interconnection. Therefore, by forming the third insulating film, the throwing power of the interconnection formed on the third insulating film can be improved.

Preferably, in the above-described method for manufacturing a silicon carbide semiconductor device, the first isotropic etching is a wet etching. Accordingly, a first recess having a larger width as leaving apart from the first main surface can be formed efficiently.

Preferably, in the above-described method for manufacturing a silicon carbide semiconductor device, the first anisotropic etching is a dry etching. Accordingly, a second recess having a substantially equal width along a normal direction of the first main surface can be formed efficiently.

Preferably, the above-described method for manufacturing a silicon carbide semiconductor device further includes the following steps. A third recess having a third inner wall surface is formed by performing a second isotropic etching with respect to the interlayer insulating film arranged on the gate electrode. After the step of forming a third recess, a fourth recess having a fourth inner wall surface is formed by performing a second anisotropic etching with respect to the interlayer insulating film and thereby exposing the gate electrode from the interlayer insulating film. In the step of forming an interconnection, the interconnection is formed which is arranged in contact with the third inner wall surface and the fourth inner wall surface and electrically connected to the gate electrode.

Since the interconnection is formed in contact with the third inner wall surface of the third recess formed by the isotropic etching, formation of the cavity inside the interconnection can be suppressed. Consequently, when a current flow through the interconnection, breaking of the interconnection can be suppressed. Therefore, the reliability of the interconnection can be improved.

Preferably, in the above-described method for manufacturing a silicon carbide semiconductor device, a thickness of the interconnection is greater than or equal to 2 µm and less than or equal to 10 µm. When the thickness of the interconnection is greater than or equal to 2 µm, a large current can flow through the interconnection. Moreover, when the thickness of the interconnection is less than or equal to 10 µm, the workability of the interconnection can be improved.

Preferably, in the above-described method for manufacturing a silicon carbide semiconductor device, the step of forming an interconnection includes the step of forming a first metal layer being in contact with the interlayer insulating film and being constituted of titanium. By forming the first metal layer being in contact with the interlayer insulating film and being constituted of titanium, the adhesion of the interconnection with respect to the interlayer insulating film can be improved.

Preferably, in the above-described method for manufacturing a silicon carbide semiconductor device, the step of forming an interconnection further includes the step of forming a second metal layer being in contact with the first metal layer and being constituted of titanium nitride or titanium tungsten. Accordingly, in the case of forming a third metal layer containing aluminum on the second metal layer, the intrusion of aluminum into the gate electrode can be suppressed.

The silicon carbide semiconductor device according to the present invention includes a silicon carbide substrate, a gate insulating film, a gate electrode, an interlayer insulating film, a first recess, a second recess, a first electrode, and a first interconnection. The silicon carbide substrate has a first main surface and a second main surface opposite to each other and includes a first conductivity type region provided in contact with the first main surface. The gate insulating film is in contact with the first main surface of the silicon carbide substrate. The gate electrode is in contact with the gate insulating film. The interlayer insulating film is in contact with the gate electrode and the gate insulating film. The first recess is formed so as to have a larger width as leaving apart form the first main surface, and a first inner wall surface is formed with an interlayer insulating film. The second recess is in connection with the first recess, and a second inner wall surface is formed with an interlayer insulating film and a gate insulating film. The first electrode is arranged in the second recess and in contact with the first conductivity type region. The first interconnection is arranged in contact with the first inner wall surface and the second inner wall surface and electrically connected to the first electrode.

According to the silicon carbide semiconductor device of the present invention, the first recess is formed so as to have a larger width as leaving apart from the first main surface, and the second recess is formed in connection with the first recess. The interconnection is arranged in contact with the first inner wall surface and the second inner wall surface. Accordingly, since the interconnection is arranged in contact with the first inner wall surface of the first recess having a larger width as leaving apart from the first main surface, formation of the cavity inside the interconnection can be suppressed. Consequently, when a current flows through the interconnection, breaking of the interconnection can be suppressed. Therefore, the reliability of the interconnection can be improved.

Preferably, in the above-described silicon carbide semiconductor device, a portion surrounding a circumferential corner portion of the gate electrode in an upper surface of the interlayer insulating film has more roundness than the circumferential corner portion of the gate electrode. Accordingly, formation of the cavity inside the interconnection formed near the portion surrounding the circumferential corner portion of the gate electrode and the upper surface of the interlayer insulating film can be suppressed efficiently.

Preferably, the above-described silicon carbide semiconductor device further includes a third recess, a fourth recess, and a second interconnection. The third recess is formed in the interlayer insulating film arranged on the gate electrode and has a third inner wall surface formed so as to have a larger width as leaving apart from the first main surface. The fourth recess is in connection with the third recess, and the fourth inner wall surface is formed with an interlayer insulating film. The second interconnection is arranged in contact with the third inner wall surface and the fourth inner wall surface and electrically connected to the gate electrode. Accordingly, since the interconnection is arranged in contact with the third inner wall surface of the third recess having a larger width as leaving apart from the first main surface, formation of the cavity inside the interconnection can be suppressed. Consequently, when a large current flows through the interconnection, breaking of the interconnection can be suppressed. Therefore, the reliability of the interconnection can be improved.

Preferably, in the above-described silicon carbide semiconductor device, the interlayer insulating film includes a first insulating film being in contact with the gate electrode and not being doped with impurities, and a second insulating film covering the first insulating film, having a lower softening point than the first insulating film, and being doped with impurities. Accordingly, the level difference in the upper surface of the interlayer insulating film can be suppressed at a low temperature. Moreover, since the first insulating film is not doped with impurities, impurities such as phosphorus are diffused at the interface between the gate insulating film and the silicon carbide substrate, so that a variation in the threshold voltage of the gate voltage can be suppressed.

Preferably, in the above-described silicon carbide semiconductor device, the interlayer insulating film further includes a third insulating film covering the second insulating film and being constituted of silicon dioxide. The third insulating film constituted of silicon dioxide has a good adhesion with the interconnection. Therefore, the throwing power of the interconnection formed on the third insulating film can be improved.

Preferably, in the above-described silicon carbide semiconductor device, the thickness of the first interconnection is greater than or equal to 2 µm and less than or equal to 10 µm. When the thickness of the interconnection is greater than or equal to 2 µm, a large current can flow through the interconnection. Moreover, when the thickness of the interconnection is less than or equal to 10 µm, the workability of the interconnection can be improved.

Preferably, in the above-described silicon carbide semiconductor device, the first interconnection includes a first metal layer being in contact with the interlayer insulating film and being constituted of titanium. By arranging the first metal layer being in contact with the interlayer insulating film and being constituted of titanium, the adhesion of the interconnection with respect to the interlayer insulating film can be improved.

Preferably, in the above-described silicon carbide semiconductor device, the first interconnection further includes a second metal layer being in contact with the first metal layer and being constituted of titanium or titanium tungsten. Accordingly, in the case where the third metal layer containing aluminum is arranged on the second metal layer, the intrusion of aluminum into the gate electrode can be suppressed.

Advantageous Effects of Invention

As is apparent from the description above, according to the present invention, a silicon carbide semiconductor device capable of improving the reliability of an interconnection and a method for manufacturing the silicon carbide semiconductor device can be provided.

DESCRIPTION OF EMBODIMENTS

Figure 1:
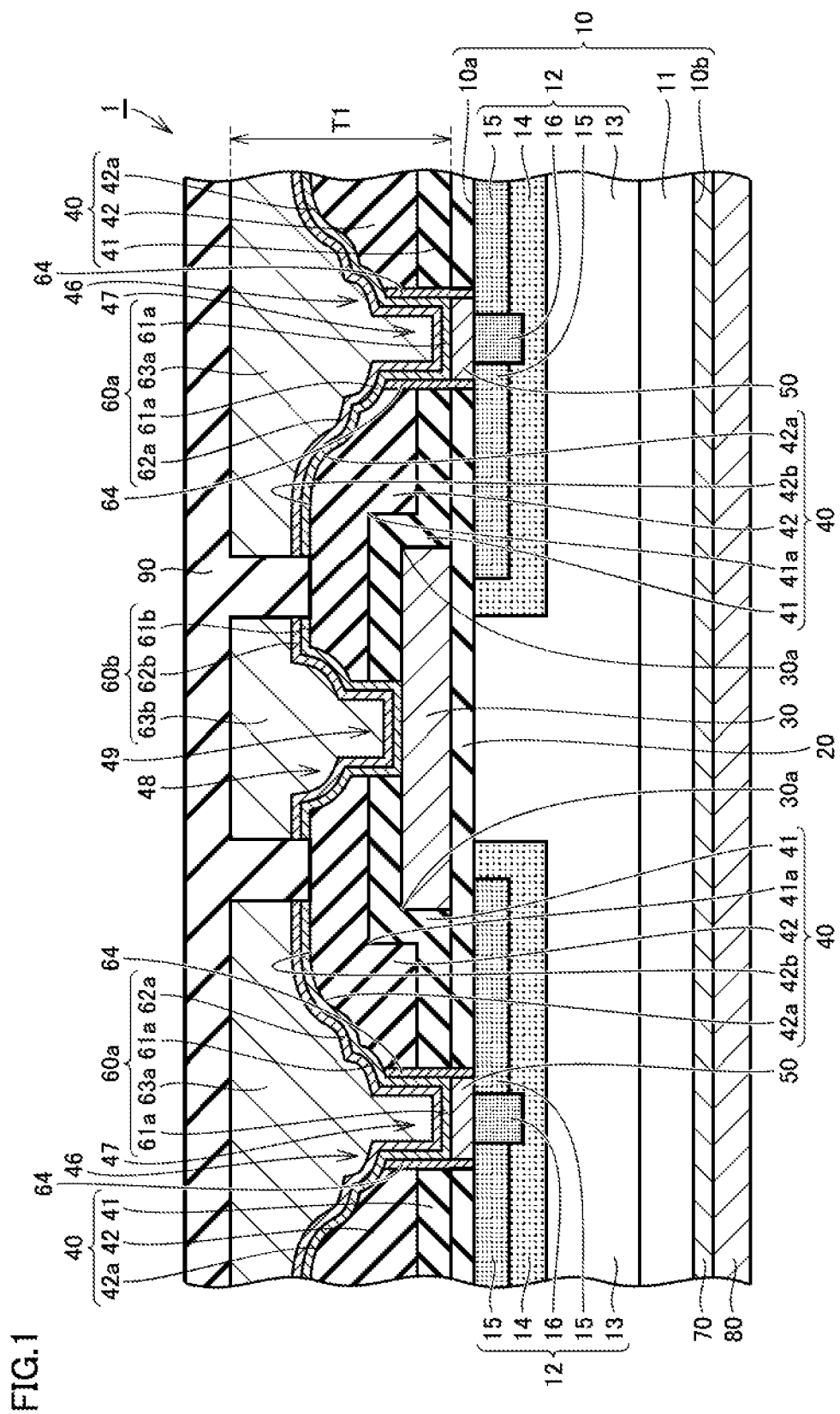
FIG. 1 is a schematic cross sectional view schematically representing a structure of a silicon carbide semiconductor device in accordance with one embodiment of the present invention.

Hereinafter, embodiments of the present invention will be described with reference to the drawings. It should be noted that the same or corresponding parts in the following drawings have the same reference numerals allotted, and description thereof will not be repeated.

Firstly, a structure of a MOSFET 1 as a silicon carbide semiconductor device according to the present embodiment will be described. Referring to FIG. 1, MOSFET 1 mainly includes a silicon carbide substrate 10, a gate insulating film 20, a gate electrode 30, an interlayer insulating film 40, a source electrode 50, a source electrode interconnection 60a, a gate electrode interconnection 60b, a drain electrode 70, a backside surface protecting electrode 80, and a passivation layer 90. Silicon carbide substrate 10 includes a base substrate 11 and an epitaxial layer 12. Moreover, epitaxial layer 12 is provided with a drift region 13, a body region 14, a source region 15, and a p$^+$ region 16.

Base substrate 11 contains an n type impurity such as N (nitrogen) and therefore has n type conductivity (first conductivity type). Epitaxial layer 12 is an epitaxial growth layer formed on base substrate 11. Drift region 13 is a first conductivity type region containing an n type impurity such as N (nitrogen) and therefore has n type conductivity as with base substrate 11, and its concentration is lower than that of base substrate 11.

Body region 14 includes a first main surface 10a of silicon carbide substrate 10 and is formed separately in epitaxial layer 12. Body region 14 is a second conductivity type region containing p type impurities such as Al (aluminum) and B (boron) and therefore having p type conductivity (second conductivity type).

Source region 15 (first conductivity type region) is a region having n type conductivity. Source region 15 includes first main surface 10a and is formed in each body region 14 so as to be surrounded by body region 14. Each of source regions 15 contains an n type impurity such as P (phosphorus), and therefore has n type conductivity as with base substrate 11 and drift region 13. Further, the concentration of the n type impurity in source region 15 is higher than the concentration of the n type impurity in drift region 13. It should be noted that source region 15 is separated from drift region 13 by body region 14.

As with source region 15, P$^+$ region 16 is surrounded by body region 14 while including first main surface 10a and formed in each body region 14 so as to be adjacent to source region 15. As with body region 14, p$^+$ region 16 contains impurities such as Al (aluminum) and B (boron) and therefore has p type conductivity. The impurity concentration of p$^+$ region 16 is higher than that of body region 14.

Gate insulating film 20 is constituted of silicon dioxide, and is disposed on and in contact with first main surface 10a, and is formed to extend from an upper surface of one source region 15 to an upper surface of the other source region 15. Gate insulating film 20 is in contact with source region 15, body region 14, and drift region 13 at first main surface 10a.

Each of gate electrodes 30 is disposed on and in contact with gate insulating film 20, and is formed to extend from one source region 15 to the other source region 15. Gate electrode 30 is made of a conductor such as polysilicon having an impurity added therein, for example. Gate electrode 30 is formed so as to sandwich gate insulating film 20 with silicon carbide substrate 10. Gate electrode 30 is arranged so as to face source region 15 and body region 14 through gate insulating film 20.

Interlayer insulating film 40 is made of, for example, a material containing silicon dioxide, and is formed so as to surround gate electrode 30 on gate insulating film 20. Preferably, interlayer insulating film 40 is formed by two layers of insulating films, and more preferably by three layers of insulating films. As shown in FIG. 1, interlayer insulating film 40 is constituted of, for example, a first insulating film 41 in contact with gate electrode 30 and gate insulating film 20, and a second insulating film dispose on and in contact with first insulating film 41.

First insulating film 41 is made of silicon which is not doped with (non dope) impurities such as phosphorus. It should be noted that, in the present specification, the insulating film not doped with impurities is an insulating film having an impurity concentration less than or equal to 1 mol %. Second insulating film 42 has a lower softening point than that of first insulating film 41. Second insulating film 42 is silicon glass doped with, for example, phosphorus (PSG: Phosphorus Silicon Glass). The doped amount of phosphorus is, for example, about greater than or equal to 7.5 mol % and less than or equal to 7.9 mol %. The thickness of first insulating film 41 is, for example, 0.2 μm, and the thickness of second insulating film 42 is, for example, 0.8 μm.

Figure 19:
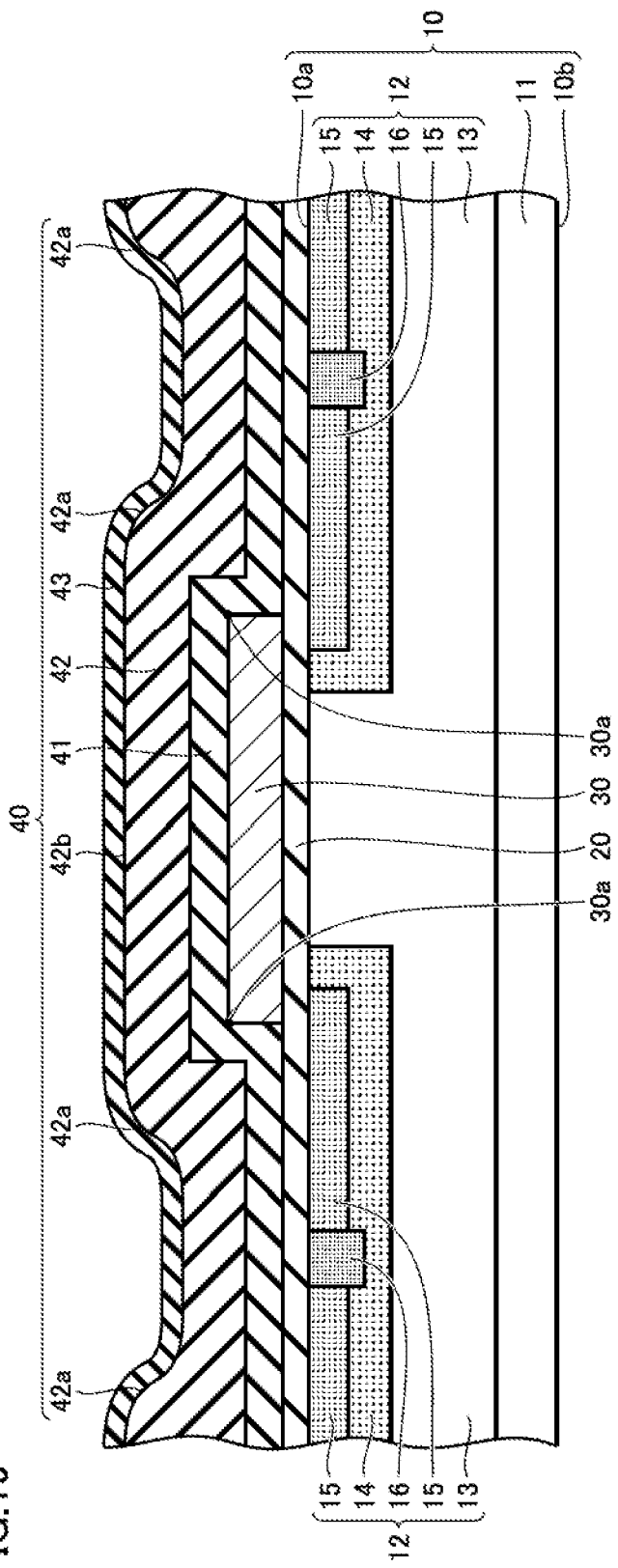
FIG. 19 is a schematic cross sectional view schematically representing a modified example of the fourth step of the method for manufacturing a silicon carbide semiconductor device in accordance with one embodiment of the present invention.

As shown in FIG. 1, a shoulder 42a of interlayer insulating film 40 surrounding circumferential corner portion 30a formed in the outer circumference of gate electrode 30 preferably has more roundness than circumferential corner portion 30a formed in the outer circumference of gate electrode 30. Moreover, when interlayer insulating film 40 is constituted of first insulating film 41 and second insulating film 42, shoulder 42a of second insulating film 42 may have more roundness than that of shoulder 41a of first insulating film 41 surrounding circumferential corner portion 30a formed in the outer circumference of gate electrode 30. Referring to FIG. 19, third insulating film 43 made of silicon dioxide may be along the upper surface of second insulating film 42 with shoulder 42a having a roundness.

In interlayer insulating film 40 above source region 15 and p$^+$ region 16, a first recess 46 and a second recess 47 in connection with first recess 46 are formed. A width W1 of first recess 46 becomes larger as leaving apart from first main surface 10a. A width W2 of second recess 47 is substantially equal to the smallest width of first recess 46. Width W2 of second recess 47 is almost constant along a normal direction of first main surface 10a.

Figure 11:
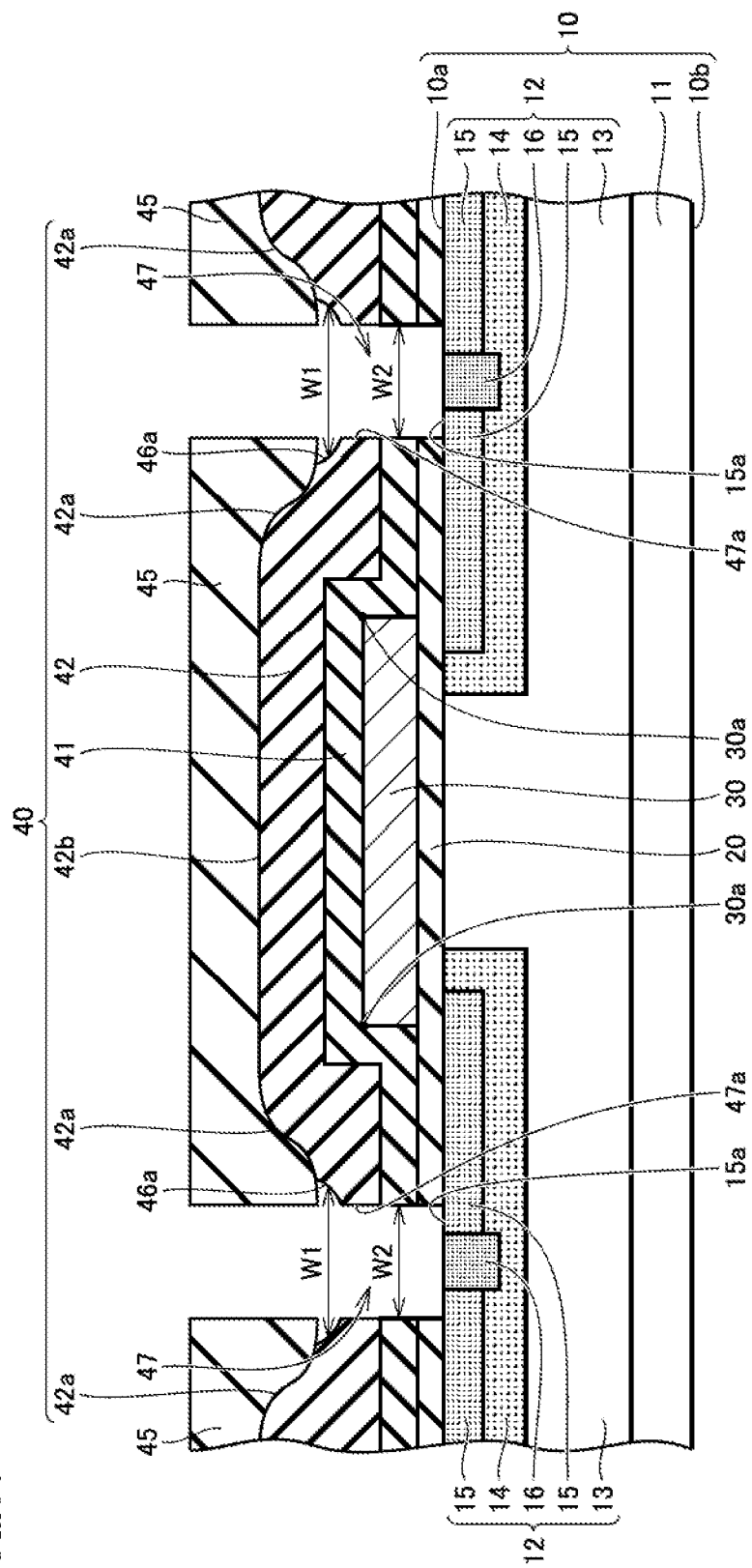
FIG. 11 is a schematic cross sectional view schematically representing the seventh step of the method for manufacturing a silicon carbide semiconductor device in accordance with one embodiment of the present invention.
Figure 12:
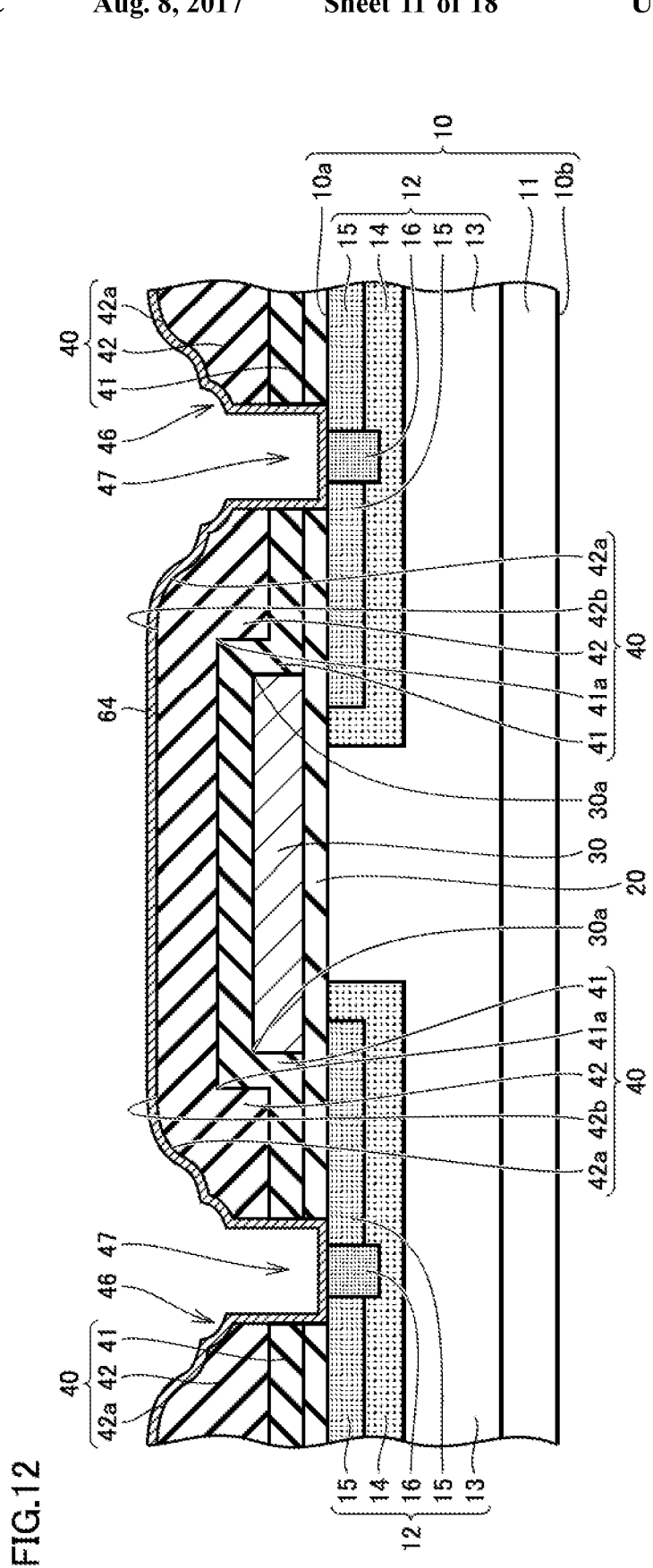
FIG. 12 is a schematic cross sectional view schematically representing the eighth step of the method for manufacturing a silicon carbide semiconductor device in accordance with one embodiment of the present invention.
Figure 13:
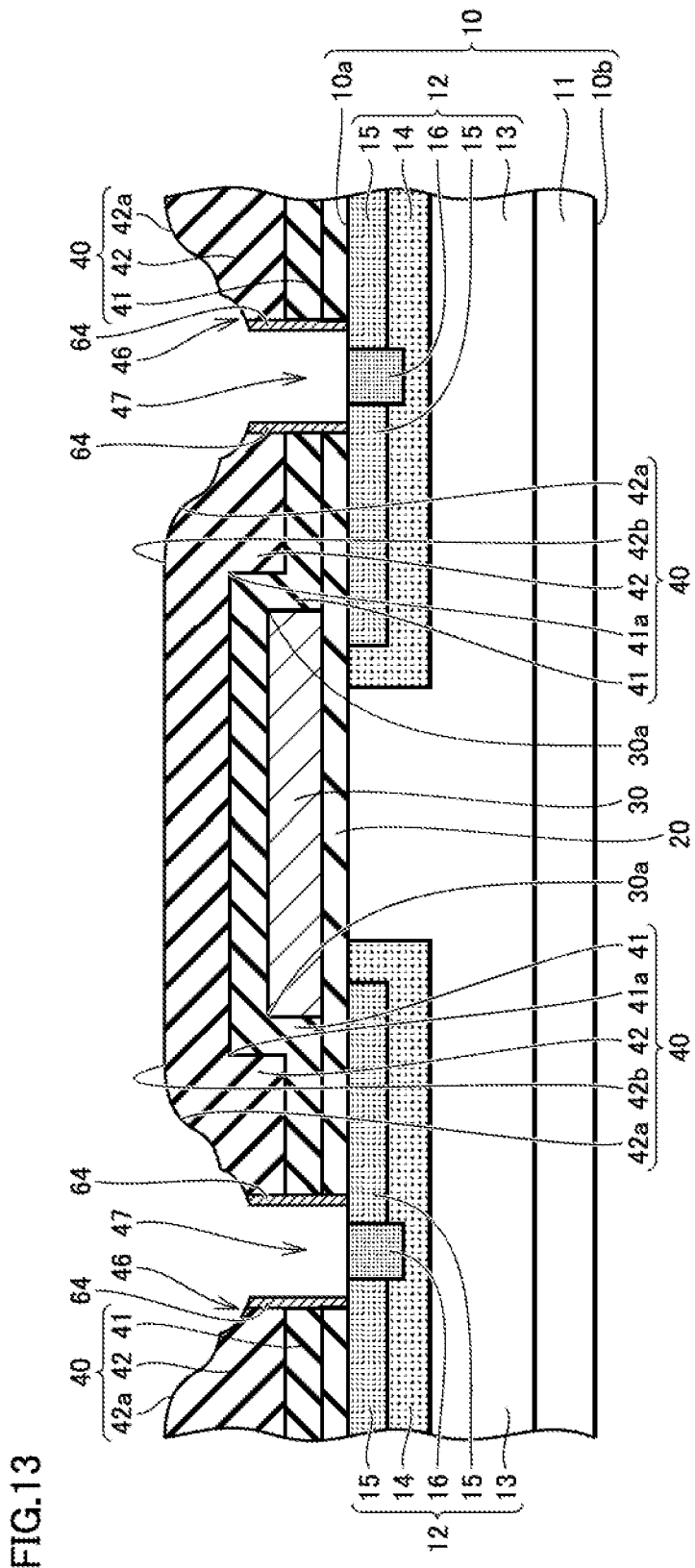
FIG. 13 is a schematic cross sectional view schematically representing the ninth step of the method for manufacturing a silicon carbide semiconductor device in accordance with one embodiment of the present invention.
Figure 14:
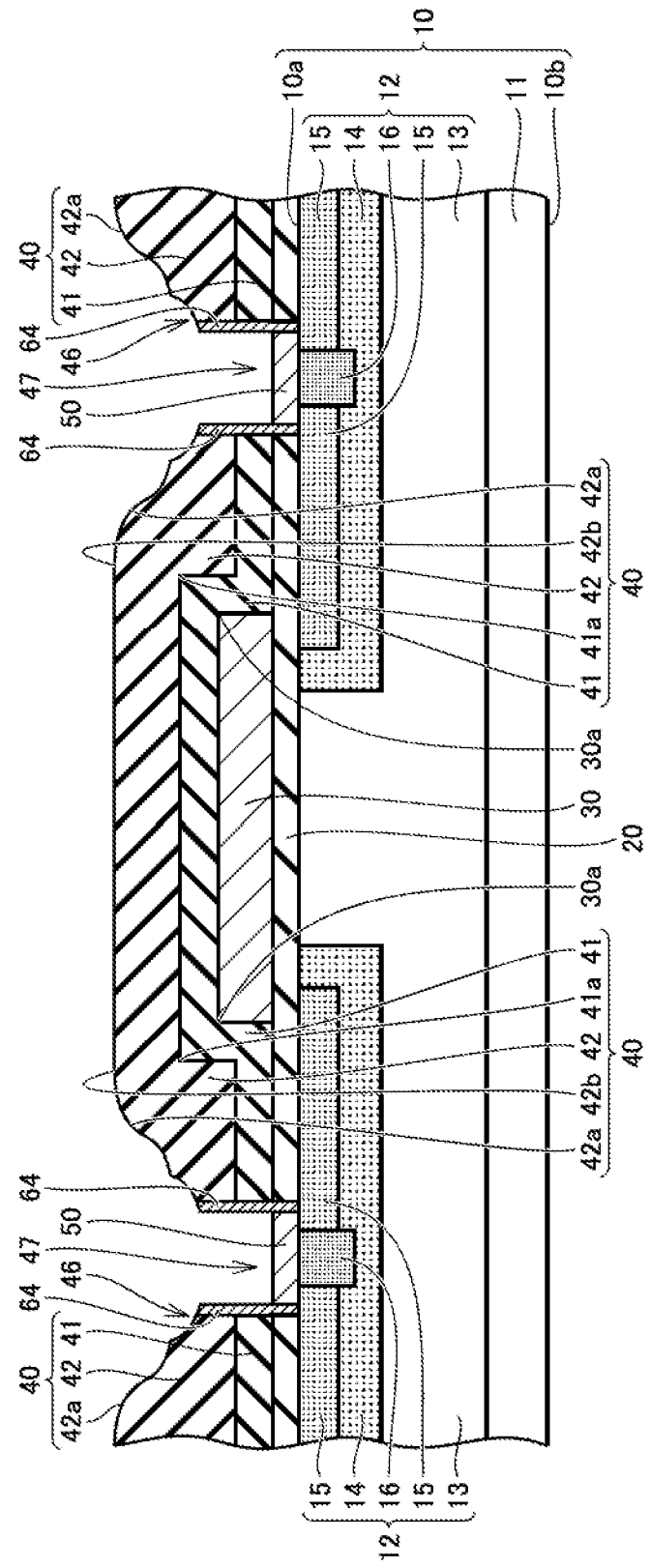
FIG. 14 is a schematic cross sectional view schematically representing the tenth step of the method for manufacturing a silicon carbide semiconductor device in accordance with one embodiment of the present invention.
Figure 15:
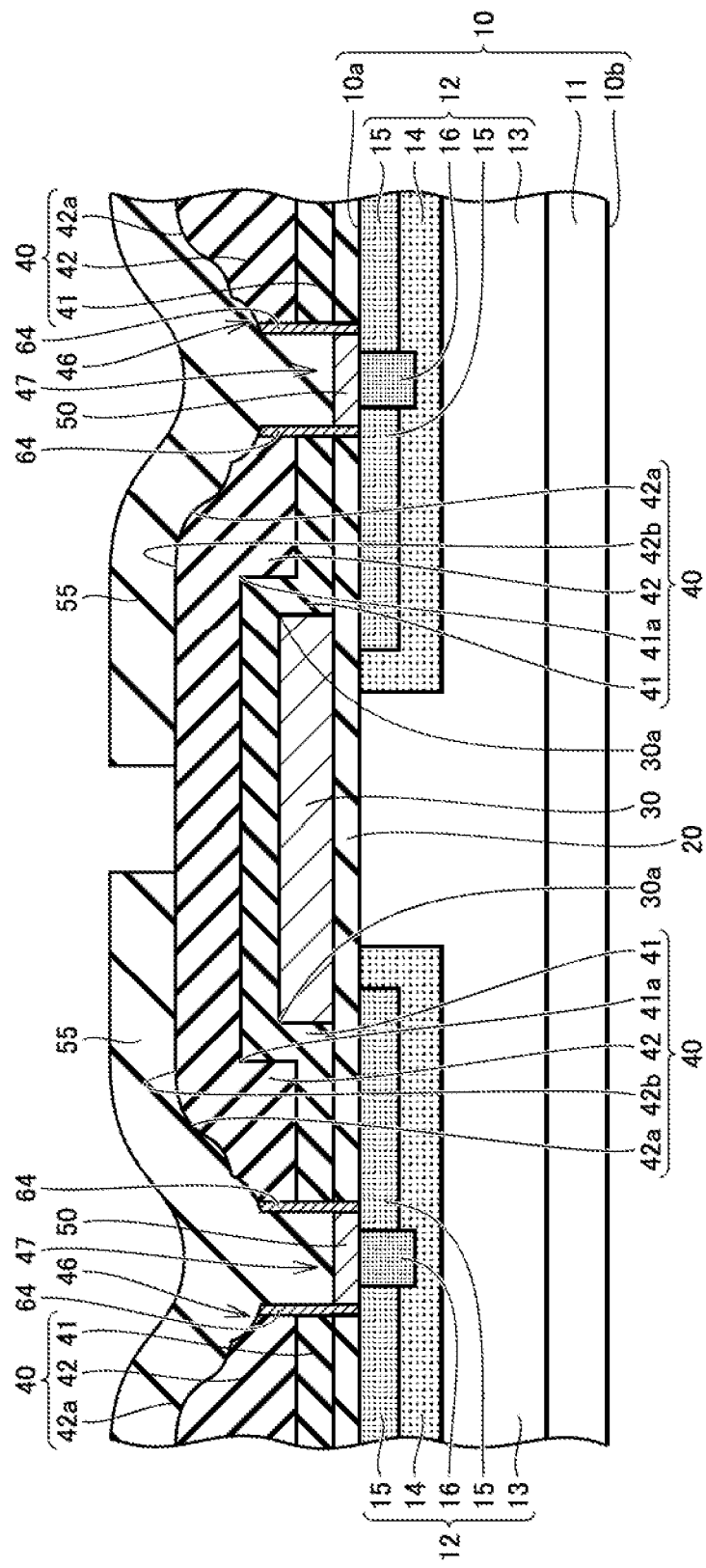
FIG. 15 is a schematic cross sectional view schematically representing the eleventh step of the method for manufacturing a silicon carbide semiconductor device in accordance with one embodiment of the present invention.
Figure 16:
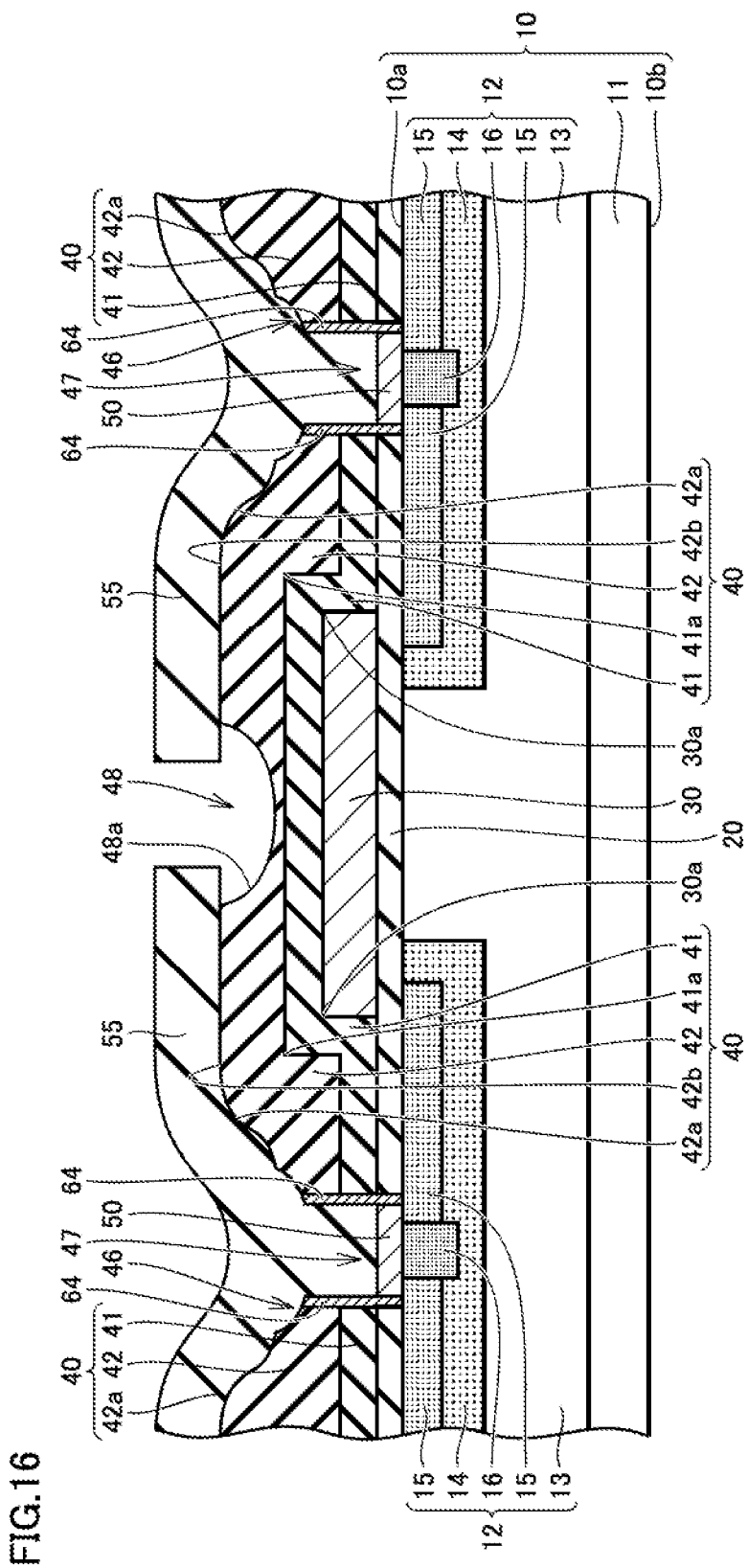
FIG. 16 is a schematic cross sectional view schematically representing the twelfth step of the method for manufacturing a silicon carbide semiconductor device in accordance with one embodiment of the present invention.

First inner wall surface 46a (refer to FIG. 11) of first recess 46 is formed with second insulating film 42 of interlayer insulating film 40. Second inner wall surface 47a (refer to FIG. 11) of second recess 47 is formed with second insulating film 42, first insulating film 41, gate insulating film 20, and first main surface 10a. First inner wall surface 46a of first recess 46 may protrude outward when viewed from inside of first recess 46. Moreover, an angle between first inner wall surface 46a of first recess 46 and first main surface 10a may be larger than an angle between second inner wall surface 47a of second recess 47 and first main surface 10a.

Referring to FIG. 1, source electrode 50 (first electrode) is in contact with source region 15 and p+ region 16 and is arranged inside of second recess 47. Preferably, source electrode 50 is a film containing Ti, Al, and Si, and is made of, for example, TiAlSi alloy. Source electrode 50 is a film containing Ni and Si, and may be, for example, NiSi alloy. Preferably, source electrode 50 is in ohmic junction with source region 15 and p+ region 16.

Interlayer insulating film 40 above gate electrode 30 is provided with a third recess 48 and a fourth recess 49 in connection with third recess 48. A width W3 of third recess 48 becomes larger as leaving apart from first main surface 10a. A width W4 of fourth recess 49 is substantially equal to the smallest width of third recess 48. Width W4 of fourth recess 49 is almost constant along a normal direction of first main surface 10a.

Figure 17:
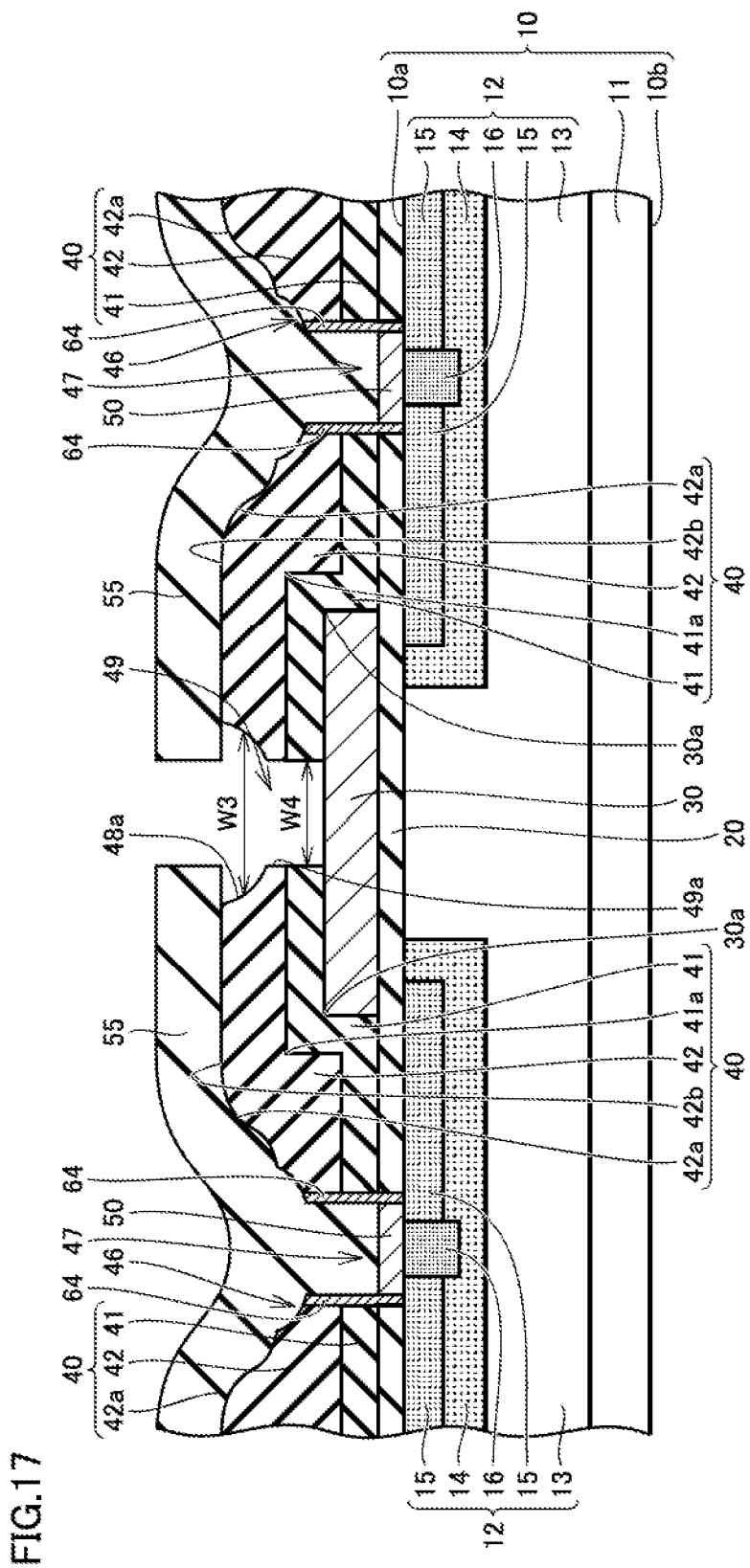
FIG. 17 is a schematic cross sectional view schematically representing the thirteenth step of the method for manufacturing a silicon carbide semiconductor device in accordance with one embodiment of the present invention.

A third inner wall surface 48a (refer to FIG. 17) of third recess 48 is formed with second insulating film 42 of interlayer insulating film 40. A fourth inner wall surface 49a (refer to FIG. 17) of fourth recess 49 is formed with second insulating film 42, first insulating film 41, and gate electrode 30. Third inner wall surface 48a of third recess 48 may protrude outward when viewed from inside of third recess 48. Moreover, an angle between third inner wall surface 48a of third recess 48 and first main surface 10a may be larger than an angle between fourth inner wall surface 49a of fourth recess 49 and first main surface 10a.

Source electrode interconnection 60a (first interconnection) is formed so as to cover source electrode 50 and interlayer insulating film 40. Source electrode interconnection 60a contains, for example, aluminum, and is electrically connected to source electrode 50. A thickness T1 of source electrode interconnection 60a is, for example, 5 µm, preferably greater than or equal to 2 µm and less than or equal to 10 µm, more preferably greater than or equal to 3 µm and less than or equal to 7 µm. A large current of, for example, about 1000 A/cm² can flow through source electrode interconnection 60a. Source electrode interconnection 60a is arranged in contact with each of first inner wall surface 46a of first recess 46 and second inner wall surface 47a of second recess 47.

Preferably, source electrode interconnection 60a includes a first metal layer 61a in contact with upper surface 42b of interlayer insulating film 40, first inner wall surface 46a of first recess 46, and source electrode 50. First metal layer 61a is preferably constituted of Ti (titanium). More preferably, source electrode interconnection 60a has a second metal layer 62a disposed on and arranged in contact with first metal layer 61a. Second metal layer 62a is preferably constituted of TiN (titanium nitride) or TiW (titanium tungsten). Source electrode interconnection 60a has a third metal layer 63a disposed on and arranged in contact with second metal layer 62a. Third metal layer 63a is preferably constituted of AlSiCu (aluminum silicon copper).

Source electrode interconnection 60a is arranged inside of each of first recess 46 and second recess 47. Each of first metal layer 61a, second metal layer 62a, and third metal layer 63a may be arranged in first recess 46, may be arranged in second recess 47, or may be arranged inside of each of first recess 46 and second recess 47. Preferably, source electrode interconnection 60a has a metal layer 64 sandwiched between interlayer insulating film 40 and first metal layer 61. Metal layer 64 is preferably constituted of TiN (titanium nitride) or TiW (titanium tungsten). Metal layer 64 may be in contact with source electrode 50 and gate insulating film 20. Metal layer 64 is arranged in contact with, for example, second inner wall surface 47a of second recess 47.

Gate electrode interconnection 60b (second interconnection) is formed so as to cover gate electrode 30 and interlayer insulating film 40. Gate electrode interconnection 60b includes, for example, aluminum and is electrically connected to gate electrode 30. Gate electrode interconnection 60b is arranged inside of third recess 48 and fourth recess 49. Preferably, gate electrode interconnection 60b includes a first metal layer 61b arranged in contact with third inner wall surface 48a of third recess 48, fourth inner wall surface 49a of fourth recess 49, and gate electrode 30. First metal layer 61b is preferably constituted of Ti (titanium). Gate electrode interconnection 60b preferably has a second metal layer 62b disposed on and arranged in contact with first metal layer 61b. Second metal layer 62b is preferably constituted of TiN (titanium nitride) or TiW (titanium tungsten). Further, gate electrode interconnection 60b preferably has a thin metal layer 63b in contact with second metal layer 62b. Third metal layer 63b is preferably constituted of AlSiCu (aluminum silicon copper).

Drain electrode 70 is formed in contact with second main surface 10b of silicon carbide substrate 10. Drain electrode 70, as with source electrode 50, may be made of, for example, TiAlSi alloy, or may be made of, for example, NiSi alloy. Drain electrode 70 is electrically connected to base substrate 11. Backside surface protecting electrode 80 is provided in contact with drain electrode 70. Backside surface protecting electrode 80 may be made of, for example, Ti (titanium), Ni (nickel), Ag (silver), or alloy constituted of those. A passivation layer 90 is formed so as to insulate source electrode interconnection 60a and gate electrode interconnection 60b. Preferably, passivation layer 90 is formed with SiN (silicon nitride) or silicon dioxide.

Next, operation of MOSFET 1 as a silicon carbide semiconductor device according to the present embodiment will be described. Referring to FIG. 1, when a voltage is applied between source electrode 50 and drain electrode 70 while an applied voltage to gate electrode 30 is lower than a threshold voltage, i.e., while it is in OFF state, a pn junction formed between body region 14 and drift region 13 is reverse-biased. Accordingly, MOSFET 1 is in the non-conductive state. Meanwhile, when gate electrode 30 is fed with a voltage equal to or greater than the threshold voltage, an inversion layer is formed in body region 14. As a result, source region 15 and drift region 13 are electrically connected to each other, whereby a current flows between source electrode 50 and drain electrode 70. In the manner described above, MOSFET 1 operates.

Next, a method for manufacturing a silicon carbide semiconductor device according to one embodiment of the present invention will be described with reference to FIGS. 2 to 19. In the method for manufacturing the silicon carbide semiconductor device according to the present embodiment, MOSFET 1 as the silicon carbide semiconductor substrate according to the above-described the present embodiment is manufactured.

Figure 2:
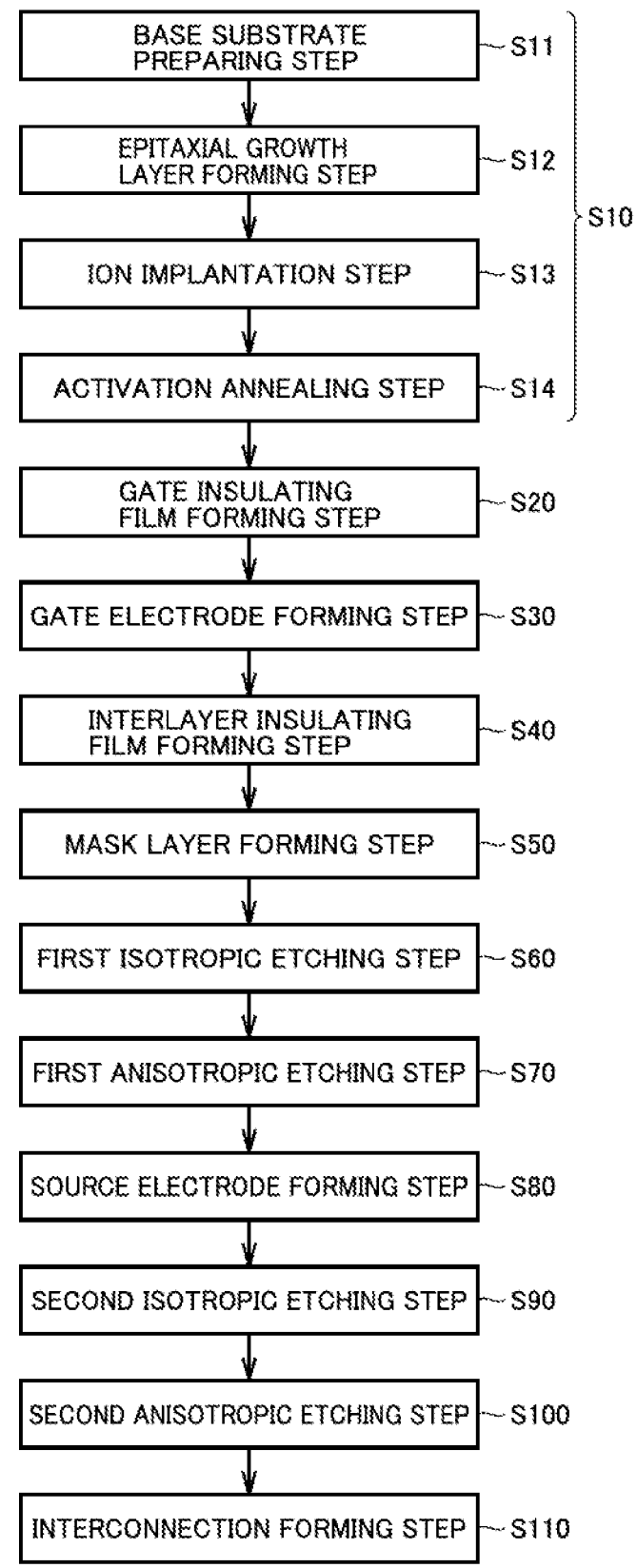
FIG. 2 is a flowchart schematically representing a method for manufacturing a silicon carbide semiconductor device in accordance with one embodiment of the present invention.

Referring to FIG. 2, firstly, a silicon carbide substrate preparing step (S10) is performed. In this step (S10), the steps (S11) to (S14) which will be described in the following are performed to prepare silicon carbide substrate 10 made of silicon carbide.

First, as step (S11) a base substrate preparing step is performed. In this step (S11), an ingot (not illustrated) made of for example, hexagonal silicon carbide of polytype 4H is sliced to prepare base substrate 11 having n type conductivity. Next, as step (S12), an epitaxial growth layer forming step is performed. In this step (S12), an epitaxial layer 12 of n type conductivity is formed on base substrate 11 by an epitaxial growth. Accordingly, a silicon carbide substrate having first main surface 10a and second main surface 10b opposite to each other is formed.

Next, as step (S13), an ion implantation step is performed. In this step (S13), referring to FIG. 5, Al (aluminum) ion, for example, is firstly implanted to a region including first main surface 10a silicon carbide substrate 10, so that body region 14 of p type conductivity (second conductivity type) is formed in epitaxial layer 12. Next, for example, P (phosphorus) ion is implanted to body region 14 at a depth smaller than an implantation depth of the above-described Al ion, so that source region 15 of n type conductivity is formed. Then, for example, Al ion is further implanted to body region 14, so that p+ region 16 being adjacent to source region 15, having the same depth as source region 15, and having p type conductivity is formed. Moreover, in epitaxial layer 12, a region in which none of body region 14, source region 15, and $p^+$ region 16 is formed becomes drift region 13.

Next, as step (S14), an activation annealing step is performed. In this step (S14), silicon carbide substrate 10 is heated to about 1800° C. under an argon atmosphere, so that the impurities incorporated in the above-described step (S13) are activated. Accordingly, desired carriers are generated in the regions having the impurities implanted therein. The above-described steps (S11) to (S14) are performed in such a manner, so that silicon carbide substrate 10 provided with an active region by incorporation of the impurities is prepared.

Next, as a step (S20), a gate insulating film forming step is performed. In this step (S20), referring to FIG. 6, silicon carbide substrate 10 is heated, for example, under an atmosphere containing oxygen, so that gate insulating film 20 being in contact with first main surface 10a of silicon carbide substrate 10 and made of silicon dioxide is formed. Next, as a step (S30), a gate electrode forming step is performed. In this step (S30), referring to FIG. 6, gate electrode 30 made of polysilicon containing impurities such as phosphorus is disposed on and formed in contact with gate insulating film 20 by, for example, an LP-CVD (Low Pressure Chemical Vapor Deposition) method. In the manner as described above, silicon carbide substrate 10 having first main surface 10a and second main surface 10b opposite to each other, having gate insulating film 20 provided in contact with first main surface 10a, having gate electrode 30 provided in contact with gate insulating film 20, and including source region 15 as a first conductivity type region in contact with first main surface 10a is prepared.

Figure 7:
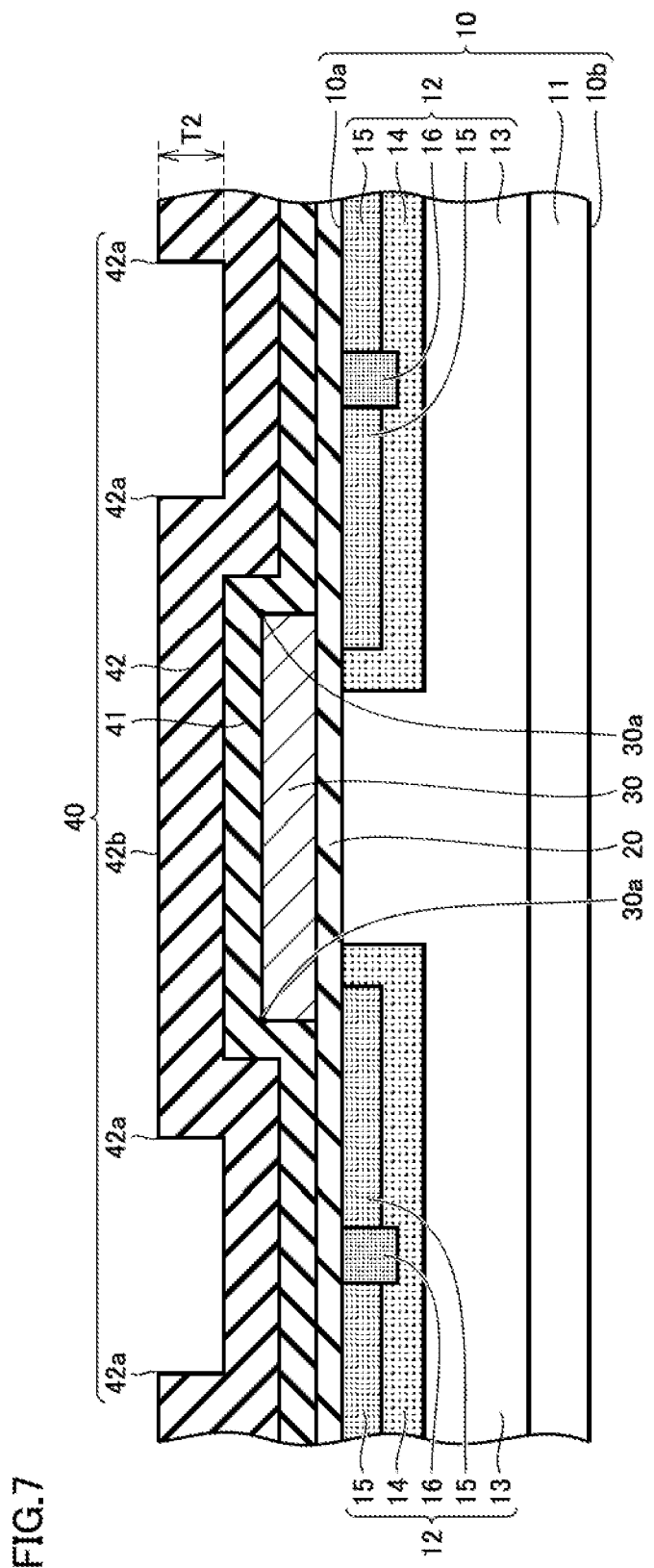
FIG. 7 is a schematic cross sectional view schematically representing the third step of the method for manufacturing a silicon carbide semiconductor device in accordance with one embodiment of the present invention.

Next, as a step (S40), an interlayer insulating film forming step is performed. In this step (S40), referring to FIG. 7, interlayer insulating film 40 is formed by, for example, a P (Plasma)-CVD method in contact with gate electrode 30 and gate insulating film 20 so as to surround gate electrode 30. Preferably, interlayer insulating film 40 includes a first insulating film 41 and a second insulating film 42 having a lower softening point than first insulating film 41. As shown in FIG. 7, first insulating film 41 covers gate electrode 30 and is formed in contact with gate electrode 30 and gate insulating film 20. Next, second insulating film 42 is formed so as to cover first insulating film 41. First insulating film 41 is made of silicon dioxide not doped (non dope) with impurities such as phosphorus, and second insulating film 42 is made of silicon glass doped with, for example, phosphorus (PSG).

Figure 8:
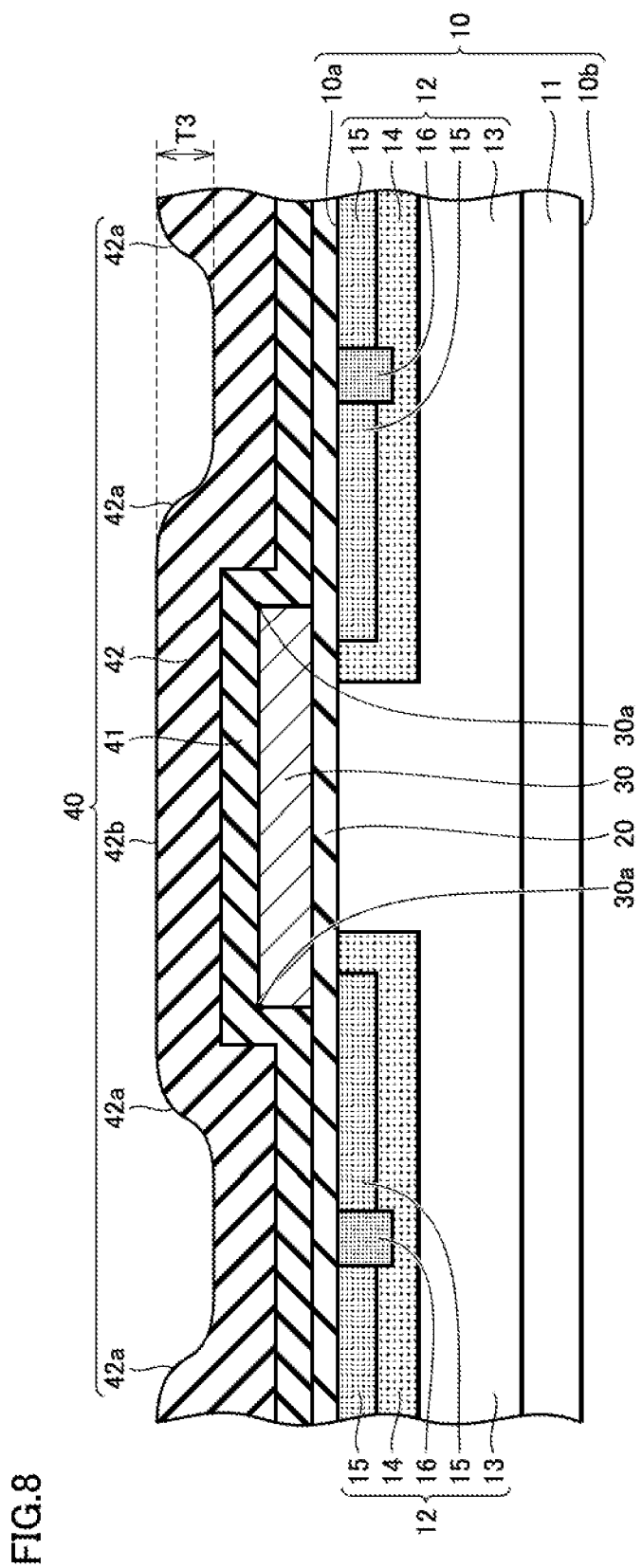
FIG. 8 is a schematic cross sectional view schematically representing the fourth step of the method for manufacturing a silicon carbide semiconductor device in accordance with one embodiment of the present invention.
Figure 9:
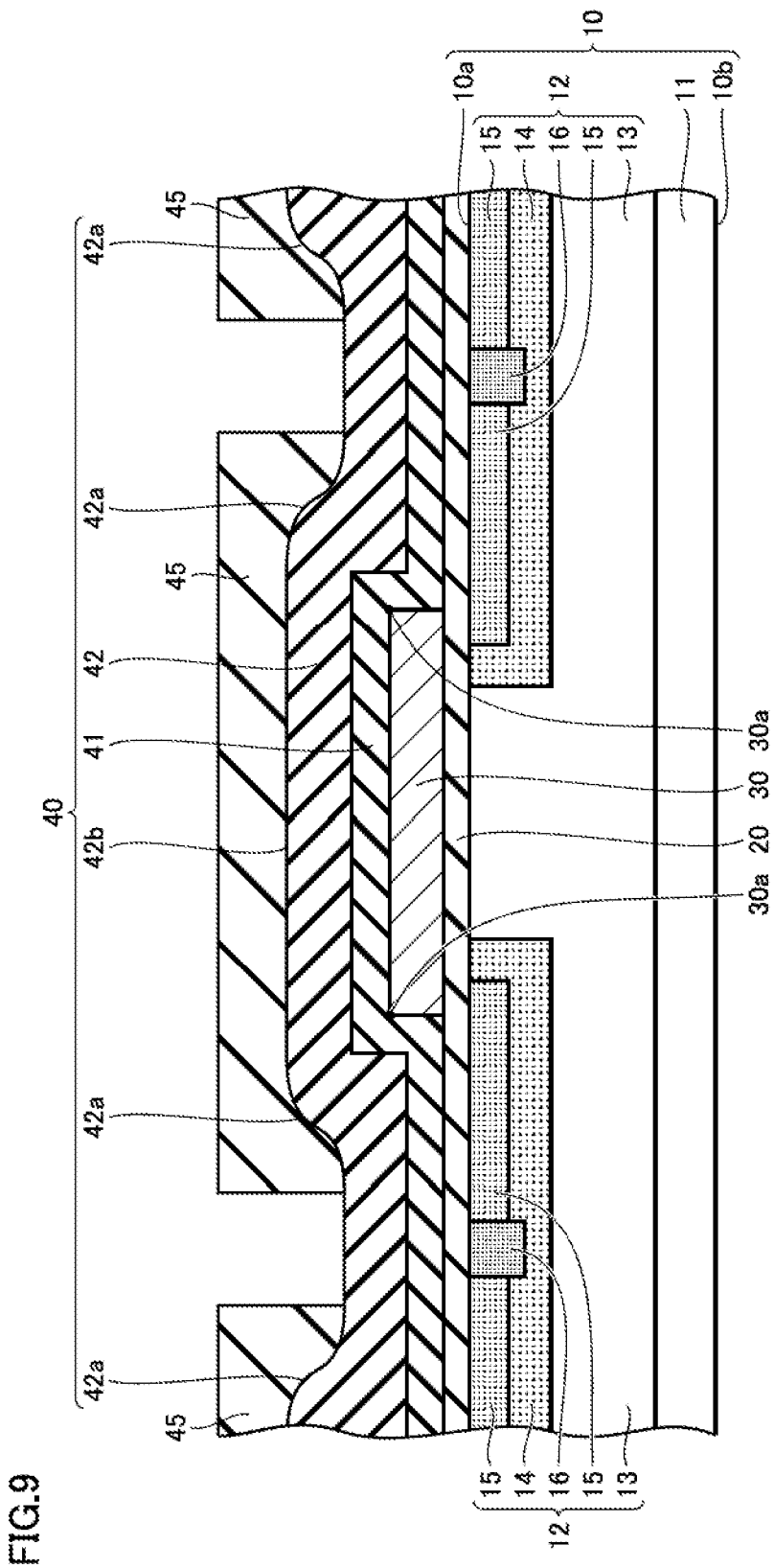
FIG. 9 is a schematic cross sectional view schematically representing the fifth step of the method for manufacturing a silicon carbide semiconductor device in accordance with one embodiment of the present invention.
Figure 10:
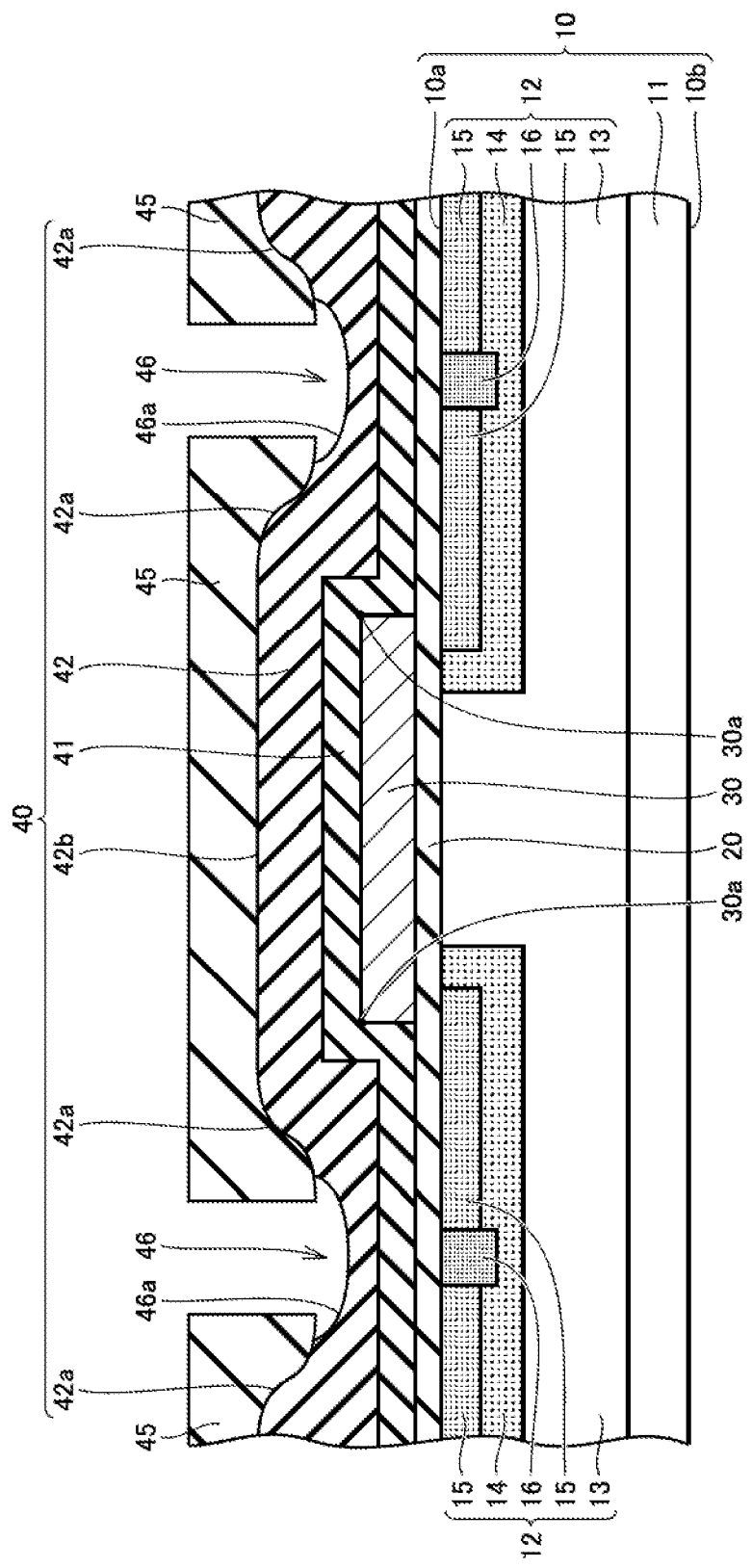
FIG. 10 is a schematic cross sectional view schematically representing the sixth step of the method for manufacturing a silicon carbide semiconductor device in accordance with one embodiment of the present invention.

Next, a step of reducing a level difference in upper surface 42b of interlayer insulating film 40 by heating interlayer insulating film 40 including first insulating film 41 and second insulating film 42 is performed. In the step of reducing a level difference, silicon carbide substrate 10 provided with interlayer insulating film 40 including first insulating film 41 and second insulating film 42 is heated to, for example, higher than or equal to 1000° C. to soften and deform second insulating film 42. Accordingly, the shape of shoulder 42a of second insulating film 42 is deformed to have a roundness as shown in FIG. 8. Consequently, the level difference of shoulder 42a of second insulating film 42 is reduced from a level difference T2 to a level difference T3. It should be noted that the temperature of heating silicon carbide substrate 10 provided with interlayer insulating film 40 including first insulating film 41 and second insulating film 42 is preferably lower than or equal to a softening point of first insulating film 41 and higher than or equal to a softening point of second insulating film 42.

Figure 3:
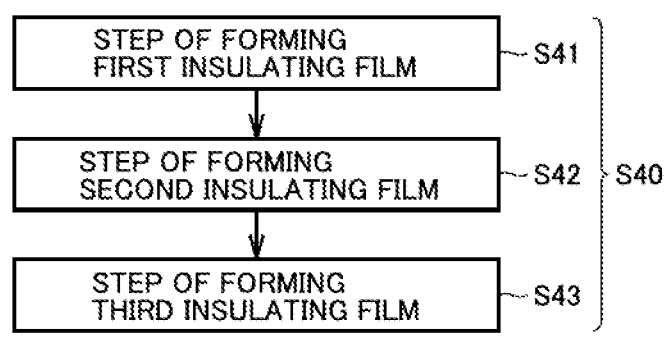
FIG. 3 is a flowchart schematically representing an interlayer insulating film forming step.

Referring to FIG. 3, the step (S40) of forming an interlayer insulating film may have a step (S41) of forming a first insulating film, a step (S42) of forming a second insulating film, and a step (S43) of forming a third insulating film. Specifically, as described above, after first insulating film 41 is formed so as to cover gate electrode 30, second insulating film 42 is formed on first insulating film 41. After second insulating film 42 is softened, and the level difference of second insulating film 42 is reduced, a third insulating film 43 may be arranged in contact with a surface of second insulating film 42 as shown in FIG. 19. Third insulating film 43 is made of, for example, silicon dioxide. The thickness of third insulating film 43 may be smaller than the thickness of second insulating film 42.

Next, as a step (S50), a mask layer forming step is performed. In this step (S50), referring to FIG. 9, a first mask layer 45 made of, for example, resist is disposed on and formed in contact with interlayer insulating film 40. Next, first mask layer 45 is patterned on source region 15 and $p^+$ region 16 so as to have an opening.

Next, as a step (S60), a first isotropic etching step is performed. In this step (S60), referring to FIG. 10, an isotropic etching is performed with respect to second insulating film 42 of interlayer insulating film 40 with use of first mask layer 45 formed in the mask layer forming step as a mask. Accordingly, first recess 46 having first inner wall surface 46a is formed in second insulating film 42 of interlayer insulating film 40. First inner wall surface 46a of first recess 46 has a shape protruding outward when viewed from inside of first recess 46. The isotropic etching is, for example, a wet etching. For example, silicon carbide substrate 10 provided with first mask layer 45 is immersed in chemical made of buffer hydrofluoric acid (115UBHF) containing surfactant for about longer than or equal to 10 seconds and shorter than or equal to 300 seconds at a room temperature, so that second insulating film 42 of interlayer insulating film 40 is etched isotropically. It should be noted that the isotropic etching may be a dry etching.

Next, as a step (S70), a first anisotropic etching step is performed. In this step (S70), referring to FIG. 11, after the first isotropic etching step, an anisotropic etching is performed with respect to second insulating film 42 and first insulating film 41 of interlayer insulating film 40 and gate insulating film 20 with use of first mask layer 45 used in the first isotropic etching step. Accordingly, second recess 47 is formed which has source region 15 and $p^+$ region 16 of silicon carbide substrate 10 exposed from gate insulating film 20 and connected to first recess 46, and second inner wall surface 47a formed with first insulating film 41 and second insulating film 42 of interlayer insulating film 40, gate insulating film 20, and first main surface 10a.

A width W2 of second recess 47 has substantially the same values along the normal direction of first main surface 10a. The anisotropic etching is, for example, a dry etching. For example, silicon carbide substrate 10 provided with first mask layer 45 is arranged in a chamber having a pressure of greater than or equal to 100 mTorr and less than or equal to 500 mTorr, and an anisotropic etching is performed with respect to second insulating film 42 and first insulating film 41 of interlayer insulating film 40 and gate insulating film 20 with use of CF4 gas under the condition having an RF (Radio Frequency) power of greater than or equal to 100 W and less than or equal to 1500 W.

Next, a metal layer forming step is performed. In the metal layer forming step, referring to FIG. 12, after first mask layer 45 is removed from interlayer insulating film 40, a metal layer 64 is formed in contact with an upper surface 46b of second insulating film 42 of interlayer insulating film 40, a first inner wall surface 46a of first recess 46, a second inner wall surface 47a of second recess 47, source region 15, and p+ region 16 by, for example, sputtering. Metal layer 64 is a film preferably containing Ti, and is a film made of, for example, TiN or TiW. The thickness of metal layer 64 is, for example, about greater than or equal to 0.025 µm and less than or equal to 0.15 µm.

Next, an etching step is performed. In the etching step, referring to FIG. 13, the dry etching is performed with respect to silicon carbide substrate 10, so that metal layer 64 formed on the upper surface of interlayer insulating film 40, first inner wall surface 46a of first recess 46, source region 15, and p+ region 16 is removed, and metal layer 64 formed on second inner wall surface 47a of second recess 47 resides.

Next, as a step (S80), a source electrode forming step is performed. In this step (S80), a source electrode 50 as a first electrode in contact with source region 15 (first conductivity type region) and p+ region 16 is formed. Specifically, referring to FIG. 14, a metal film containing, for example, Ti, Al, and Si is formed in contact with source region 15, p+ region 16, and second metal layer 62 by sputtering. Next, by heating silicon carbide substrate 10 provided with the metal film, the metal film is alloyed, so that source electrode 50 in ohmic junction with silicon carbide substrate 10 is formed.

Next, as a step (S90), a second isotropic etching step is performed. In this step (S90), referring to FIG. 15, a second mask layer 55 made of, for example, resist is disposed on and formed in contact with interlayer insulating film 40. Next, second mask layer 55 is patterned so as to have an opening above gate electrode 30. Next, referring to FIG. 16, with use of second mask layer 55 as a mask, the isotropic etching is performed with respect to second insulating film 42 of interlayer insulating film 40 arranged on gate electrode 30. Accordingly, a third recess 48 having a third inner wall surface 48a is formed in second insulating film 42 of interlayer insulating film 40. Third inner wall surface 48a of third recess 48 has a shape protruding outward from inside of first recess 46. The isotropic etching is, for example, a wet etching. It should be noted that the condition for the second isotropic etching is substantially the same as the condition for the first isotropic etching.

Next, as a step (S100), a second anisotropic etching step is performed. In this step (S100), referring to FIG. 17, after the second isotropic etching step, the anisotropic etching is performed with respect to second insulating film 42 and first insulating film 41 of interlayer insulating film 40 arranged on gate electrode 30 with use of second mask layer 55 used in the second isotropic etching step. Accordingly, a fourth recess 49 is formed which has gate electrode 30 exposed from interlayer insulating film 40 and connected to third recess 48, and a fourth inner wall surface 49a formed with first insulating film 41 and second insulating film 42 of interlayer insulating film 40 and gate electrode 30. A width W of fourth recess 49 has substantially the same values along the normal direction of first main surface 10a. The anisotropic etching is, for example, a dry etching. It should be noted that the condition for the second anisotropic etching is substantially the same as the condition for the first anisotropic etching.

Figure 4:
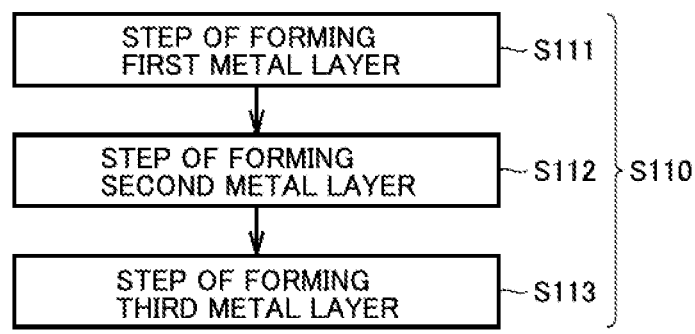
FIG. 4 is a flowchart schematically representing an interconnection forming step.
Figure 5:
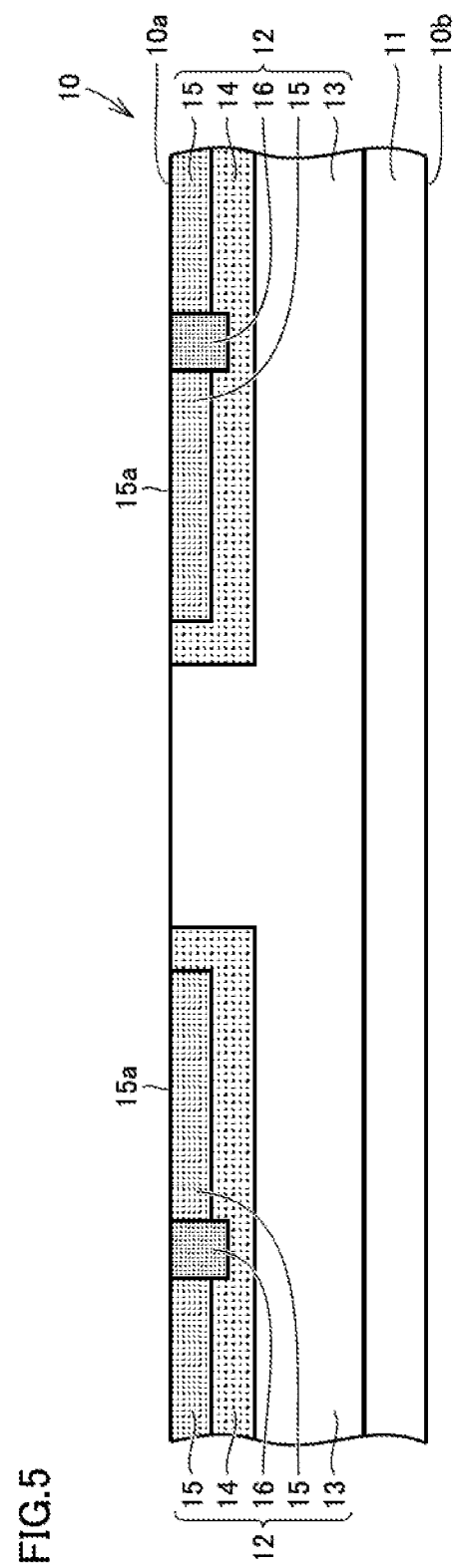
FIG. 5 is a schematic cross sectional view schematically representing the first step of the method for manufacturing a silicon carbide semiconductor device in accordance with one embodiment of the present invention.
Figure 6:
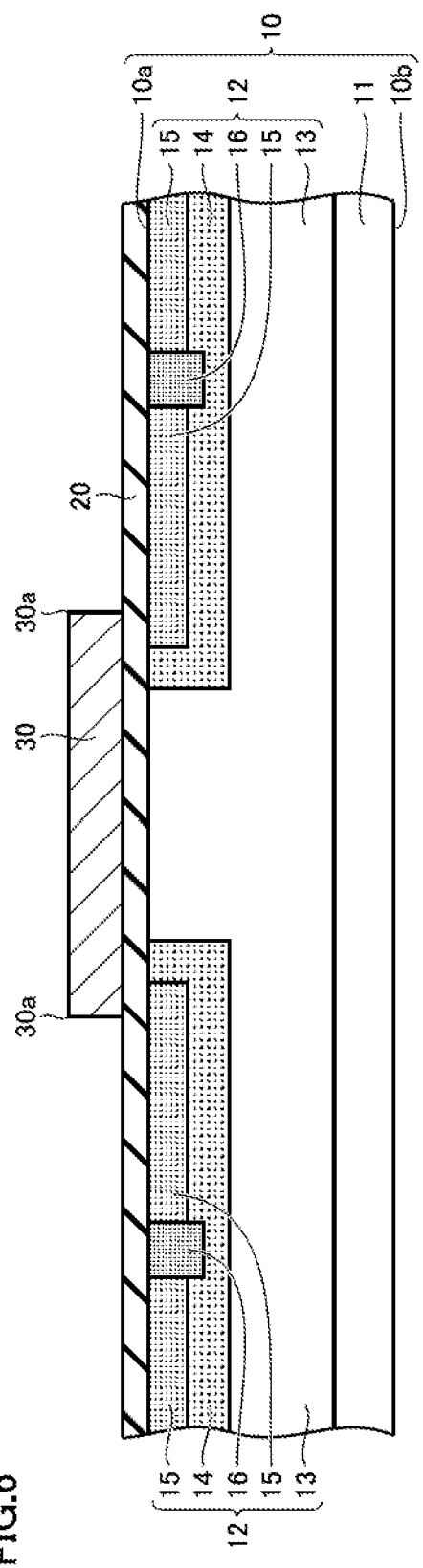
FIG. 6 is a schematic cross sectional view schematically representing the second step of the method for manufacturing a silicon carbide semiconductor device in accordance with one embodiment of the present invention.

Next, as a step (S110), an interconnection forming step is performed. In this step (S110), an interconnection 60 is formed which is arranged inside of first recess 46 and second recess 47 and in contact with source region 15 and p+ region 16. Referring to FIG. 4, the interconnection forming step (S110) preferably has a step (S111) of forming a first metal layer, a step (S112) of forming a second metal layer, and a step (S113) of forming a third metal layer.

Figure 18:
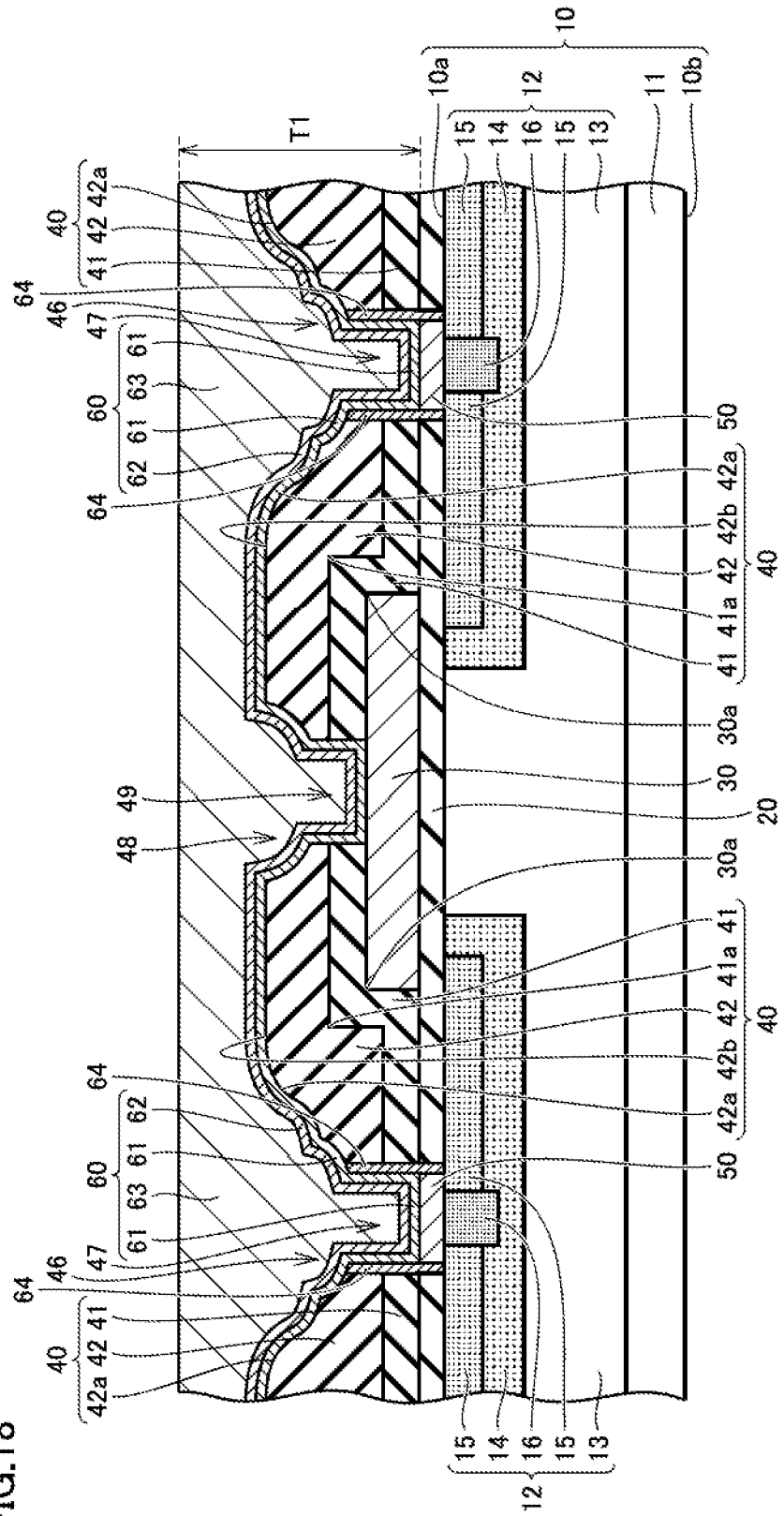
FIG. 18 is a schematic cross sectional view schematically representing the fourteenth step of the method for manufacturing a silicon carbide semiconductor device in accordance with one embodiment of the present invention.

Referring to FIG. 18, firstly by the sputtering method, a first metal layer 61 is formed which is in contact with, for example, second insulating film 42 and first insulating film 41 of interlayer insulating film 40, gate electrode 30, source electrode 50, and metal layer 64. First metal layer 61 is constituted of, for example, Ti (titanium). Next, second metal layer 62 is formed on first metal layer 61. Second metal layer 62 is constituted of, for example, TiN (titanium nitride) or TiW (titanium tungsten). Next, a third metal layer 63 is disposed on and formed in contact with second metal layer 62. Third metal layer 63 preferably contains Al, Si, and Cu, and is made of, for example, AlSiCu alloy. A thickness T1 of interconnection 60 is preferably greater than or equal to 2 µm and less than or equal to 10 µm, and more preferably greater than or equal to 3 µm and less than or equal to 7 µm, which is 5 µm, for example. Interconnection 60 is formed in contact with first side wall surface 46a of first recess 46, second side wall surface 47a of second recess 47, third side wall surface 48a of third recess 48, and fourth side wall surface 49a of fourth recess 49.

Next, referring to FIG. 1, interconnection 60 is patterned, so that a source electrode interconnection 60a and a gate electrode interconnection 60b insulated from each other by a passivation layer 90 is formed. Source electrode interconnection 60a is formed so as to be in contact with first side wall surface 46a of first recess 46 and second side wall surface 47a of second recess 47 and electrically connected to source electrode 50. Gate electrode interconnection 60b is formed so as to be in contact with third side wall surface 48a of third recess 48 and fourth side wall surface 49a of fourth recess 49 and electrically connected to gate electrode 30. In the manner as described above, MOSFET 1 according to the present embodiment is manufactured.

It should be noted that, in the present embodiment, the case is described where third recess 48 and fourth recess 49 for arranging gate electrode interconnection 60b therein are formed after first recess 46 and second recess 47 for arranging source electrode interconnection 60a therein are formed. However, third recess 48 and fourth recess 49 for arranging gate electrode interconnection 60b therein before first recess 46 and second recess 47 for arranging source electrode interconnection 60a therein are formed.

Moreover, first recess 46 and third recess 48 may be formed at the same time. When first recess 46 and third recess 48 are formed at the same time, first mask layer 45 having openings above gate electrode 30 and above source electrode 50 is formed, and the isotropic etching is performed with respect to interlayer insulating film 40 with use of first mask layer 45, so that first recess 46 and third recess 48 are formed in interlayer insulating film 40. Next, with use of first mask layer 45, the anisotropic etching is performed with respect to the interlayer insulating film 40 and gate insulating film 30 above source region 15 and p+ region 16, so that second recess 47 is formed, and fourth recess 49 is formed with respect to interlayer insulating film 40 above gate electrode 30. Second recess 47 and fourth recess 49 may be formed at the same time or separately.

In the present embodiment, a MOSFET is described as an example of a silicon carbide semiconductor device. However, the silicon carbide semiconductor device may be, for example, an IGBT (Insulated Gate Bipolar Transistor) or the like. In the case where the silicon carbide semiconductor device is an IGBT, first electrode 50 is an emitter electrode, and first interconnection 60a is an emitter electrode interconnection. Moreover, in the present embodiment, it is described that n type and p type are first conductivity type and second conductivity type respectively. However, the n type and p type may be second conductivity type and first conductivity type respectively.

Next, effects of a silicon carbide semiconductor device according to the present embodiment and the method for manufacturing a silicon carbide semiconductor device will be described.

According to the method for manufacturing MOSFET 1 of the present embodiment, after first recess 46 is formed in interlayer insulating film 40 by performing the isotropic etching, second recess 47 is formed by performing the anisotropic etching and thereby exposing source region 15. Source electrode interconnection 60a is formed which is arranged in contact with first inner wall surface 46a of first recess 46 and second inner wall surface 47a of second recess 47 and connected to source electrode 50. By the isotropic etching, first recess 46 having first inner wall surface 46a having a roundness in interlayer insulating film 40 is formed. Since source electrode interconnection 60a is arranged in contact with first inner wall surface 46a, formation of a cavity inside of source electrode interconnection 60a can be suppressed. Consequently, since breaking of source electrode interconnection 60a can be suppressed when a large current flows through source electrode interconnection 60a, the reliability of source electrode interconnection 60a can be improved.

Moreover, according to the method for manufacturing MOSFET 1 of the present embodiment, the step of forming interlayer insulating film 40 includes the step of reducing level difference T2 of upper surface 42b of interlayer insulating film 40 by heating interlayer insulating film 40. Accordingly, since interconnection 60 is formed on interlayer insulating film 40 having reduced level difference T2 of upper surface 42b, generation of a cavity inside of interconnection 60 can be suppressed efficiently.

Further, according to the method for manufacturing MOSFET 1 of the present embodiment, the step of forming interlayer insulating film 40 includes the step of forming first insulating film 41 which is in contact with gate electrode 30 and not doped with impurities, and the step of forming second insulating film 42 covering first insulating film 41, having a lower softening point than first insulating film 41, and being doped with impurities. Accordingly, level difference T2 of upper surface 42b of interlayer insulating film 40 can be reduced at a low temperature. Moreover, since first insulating film 41 is not doped with impurities, impurities such as phosphorus are diffused on the interface between gate insulating film 20 and silicon carbide substrate 10, so that variation in the threshold value of the gate voltage can be suppressed.

Further, according to the method for manufacturing MOSFET 1 of the present embodiment, the step of forming interlayer insulating film 40 further includes the step of forming third insulating film 43 covering second insulating film 42 and being constituted of silicon dioxide. Third insulating film 43 constituted of silicon dioxide has a good adhesion with interconnection 60. Therefore, the throwing power of interconnection 60 formed on third insulating film 43 can be improved by forming third insulating film 43.

Further, according to the method for manufacturing MOSFET 1 of the present invention, the first isotropic etching is a wet etching. Accordingly, first recess 46 having a larger width W1 as leaving apart from first main surface 10a can be formed efficiently.

Further, according to the method for manufacturing MOSFET 1 of the present embodiment, the first anisotropic etching is a dry etching. Accordingly, second recess 47 having a substantially equal width W2 along the normal direction of first main surface 10a can be formed efficiently.

Further, according to the method for manufacturing MOSFET 1 of the present embodiment, since gate electrode interconnection 60b is formed in contact with third inner wall surface 48a of third recess 48 formed by the isotropic etching, formation of a cavity inside of gate electrode interconnection 60b can be suppressed. Consequently, since breaking of gate electrode interconnection 60b can be suppressed when a large current flows through gate electrode interconnection 60b, the reliability of gate electrode interconnection 60b can be improved.

Further, according to the method for manufacturing MOSFET of the present embodiment, thickness T1 of interconnection 60 is greater than or equal to 2 μm and less than or equal to 10 μm. When the thickness of interconnection 60 is greater than or equal to 2 μm, a large current can flow through interconnection 60. Moreover, when thickness T1 of interconnection 60 is less than or equal to 10 μm, the workability of interconnection 60 can be improved.

Further, according to the method for manufacturing MOSFET 1 of the present embodiment, the step of forming interconnection 60 includes the step of forming first metal layer 61 which is in contact with interlayer insulating film 40 and constituted of titanium. By forming first metal layer 61 constituted of titanium in contact with interlayer insulating film 40, the adhesion of interconnection 60 with respect to interlayer insulating film 40 can be improved.

Further, according to the method for manufacturing MOSFET 1 of the present embodiment, the step of forming interconnection 60 further includes the step of forming second metal layer 62 which is in contact with first metal layer 61 and constituted of titanium nitride or titanium tungsten. Accordingly, in the case of forming third metal layer 63 containing aluminum on second metal layer 62, intrusion of aluminum into gate electrode 30 can be suppressed.

According to MOSFET 1 of the present embodiment, first recess 46 is formed so as to have larger width W1 as leaving apart from first main surface 10a, and second recess 47 is formed so as to be connected to first recess 46. Source electrode interconnection 60a is arranged in contact with first inner wall surface 46a and second inner wall surface 47a. Accordingly, since source electrode interconnection 60a is arranged in contact with first inner wall surface 46a of first recess 46 having larger width W1 as leaving apart from first main surface 10a, formation of a cavity inside of source electrode interconnection 60a can be suppressed. Consequently, since breaking of source electrode interconnection 60a can be suppressed when a large current flows through source electrode interconnection 60a, the reliability of source electrode interconnection 60a can be improved.

Moreover, according to MOSFET 1 of the present embodiment, shoulder 42a surrounding circumferential corner portion 30a of gate electrode 30 on upper surface 42b of interlayer insulating film 40 has more roundness than circumferential corner portion 30 of gate electrode 30. Accordingly, formation of a cavity inside of source electrode interconnection 60a formed near shoulder 42a surrounding circumferential corner portion 30a of gate electrode 30 on upper surface 42b of interlayer insulating film 40 can be suppressed efficiently.

Further, according to MOSFET 1 of the present embodiment, since gate electrode interconnection 60b is arranged in contact with third inner wall surface 48a of third recess 48 having a larger width W3 as leaving apart from first main surface 10a, formation of a cavity inside of gate electrode interconnection 60b can be suppressed. Consequently, since breaking of gate electrode interconnection 60b can be suppressed when a large current flows through gate electrode interconnection 60b, the reliability of gate electrode interconnection 60b can be improved.

Further, according to MOSFET 1 of the present embodiment, interlayer insulating film 40 includes first insulating film 41 being in contact with gate electrode 30 and not being doped with impurities, and second insulating film 42 covering first insulating film 41, having a lower softening point than first insulating film 41, and being doped with impurities. Accordingly, level difference T2 of upper surface 42b of interlayer insulating film 40 can be reduced at a low temperature. Moreover, since first insulating film 41 is not doped with impurities, impurities such as phosphorus are diffused on the interface between gate insulating film 20 and silicon carbide substrate 10, so that variation in the threshold voltage of the gate voltage can be suppressed.

Further, according to MOSFET 1 of the present embodiment, interlayer insulating film 40 further includes third insulating film 43 covering second insulating film 42 and being constituted of silicon dioxide. Third insulating film 43 constituted of silicon dioxide has a good adhesion with source electrode interconnection 60a and gate electrode interconnection 60b. Therefore, the throwing power of source electrode interconnection 60a and gate electrode interconnection 60b formed on third insulating film 43 can be improved.

Further, according to MOSFET 1 of the present embodiment, thickness T1 of source electrode interconnection 60a is greater than or equal to 2 μm and less than or equal to 10 μm. When thickness T1 of source electrode interconnection 60a is greater than or equal to 2 μm, a large current can flow through source electrode interconnection 60a. Moreover, when thickness T1 of source electrode interconnection 60a is less than or equal to 10 μm, the workability of source electrode interconnection 60a can be improved.

Further, according to MOSFET 1 of the present embodiment, source electrode interconnection 60a includes first metal layer 61 which is in contact with interlayer insulating film 40 and constituted of first metal layer 61. By arranging first metal layer 61 which is in contact with interlayer insulating film 40 and constituted of titanium, the adhesion of source electrode interconnection 60a with respect to interlayer insulating film 40 can be improved.

Further, according to MOSFET 1 of the present embodiment, source electrode interconnection 60a further includes second metal layer 62 which is in contact with first metal layer 61 and constituted of titanium nitride or titanium tungsten. Accordingly, in the case where third metal layer 63 containing aluminum is arranged on second metal layer 62, intrusion of aluminum into gate electrode 30 can be suppressed.

It is to be understood that the embodiments and examples disclosed herein are only by way of example, and not to be taken by way of limitation. The scope of the present invention is not limited by the description above, but rather by the terms of the appended claims, and is intended to include any modifications within the scope and meaning equivalent to the terms of the claims.

REFERENCE SIGNS LIST

1 MOSFET; 10 silicon carbide substrate; 10a first main surface; 10b second main surface; 11 base substrate; 12 epitaxial layer; 13 drift region; 14 body region; 15 source region (first conductivity type region); 16 p+ region; 20 gate insulating film; 30 gate electrode; 30a circumferential corner portion; 40 interlayer insulating film; 41 first insulating film; 41a, 42a shoulder; 42 second insulating film; 42b upper surface; 43 third insulating film; 45 first mask layer; 46 first recess; 46a first inner wall surface; 47 second recess; 47a second inner wall surface; 48 third recess; 48a third inner wall surface; 49 fourth recess; 49a fourth inner wall surface; 50 source electrode (first electrode); 55 second mask layer; 60 interconnection; 60a source electrode interconnection (first interconnection); 60b gate electrode interconnection (second interconnection); 61, 61a, 61b first metal layer; 62, 62a, 62b second metal layer; 63, 63a, 63b third metal layer; 64 metal layer; 70 drain electrode; 80 backside surface protecting electrode; 90 insulator; T1 thickness; T2, T3 level difference; W1, W2, W3, W4 width.

The invention claimed is:
1. A method for manufacturing a silicon carbide semiconductor device, comprising the steps of:
preparing a silicon carbide substrate, said silicon carbide substrate having a first main surface and a second main surface opposite to each other, having a gate insulating film provided in contact with said first main surface, having a gate electrode provided in contact with said gate insulating film, and including a first conductivity type region in contact with said first main surface;
forming an interlayer insulating film in contact with said gate electrode and said gate insulating film;
forming a mask layer in contact with said interlayer insulating film;
forming a first recess having a first inner wall surface formed in said interlayer insulating film by performing a first isotropic etching with respect to said interlayer insulating film with use of said mask layer;
after said step of forming a first recess, forming a second recess having a second inner wall surface by performing a first anisotropic etching with respect to said interlayer insulating film and said gate insulating film with use of said mask layer and thereby exposing said first conductivity type region of said silicon carbide substrate from said gate insulating film;
forming a first electrode in contact with said first conductivity type region; and
forming an interconnection being arranged in contact with said first inner wall surface and said second inner wall surface and electrically connected to said first electrode, wherein the second inner wall surface is formed with the gate insulating film and the interlayer insulating film, wherein the gate insulating film is exposed to the second inner wall surface, and wherein said step of forming an interconnection includes:
a step of forming a first metal layer including titanium being in contact with said first inner wall surface and said second inner wall surface, and
a step of removing said first metal layer on said first inner wall surface while leaving said first metal layer on said second inner wall surface.

2. The method for manufacturing a silicon carbide semiconductor device according to claim 1, wherein said step of forming an interlayer insulating film includes the step of reducing a level difference of an upper surface of said interlayer insulating film by heating said interlayer insulating film.

3. The method for manufacturing a silicon carbide semiconductor device according to claim 1, wherein said step of forming an interlayer insulating film includes the step of forming a first insulating film being in contact with said gate electrode and not being doped with impurities, and the step of forming a second insulating film covering said first insulating film, having a lower softening point than said first insulating film, and being doped with impurities.

4. The method for manufacturing a silicon carbide semiconductor device according to claim 3, wherein said step of forming an interlayer insulating film further includes the step of forming a third insulating film covering said second insulating film and being constituted of silicon dioxide.

5. The method for manufacturing a silicon carbide semiconductor device according to claim 1, wherein said first isotropic etching is a wet etching.

6. The method for manufacturing a silicon carbide semiconductor device according to claim 1, wherein said first anisotropic etching is a dry etching.

7. The method for manufacturing a silicon carbide semiconductor device according to claim 1, further comprising the steps of:
forming a third recess having a third inner wall surface by performing a second isotropic etching with respect to said interlayer insulating film arranged on said gate electrode; and
after said step of forming a third recess, forming a fourth recess having a fourth inner wall surface by performing a second anisotropic etching with respect to said interlayer insulating film and thereby exposing said gate electrode from said interlayer insulating film,
in said step of forming an interconnection, said interconnection is formed which is arranged in contact with said third inner wall surface and said fourth inner wall surface and electrically connected to said gate electrode.

8. The method for manufacturing a silicon carbide semiconductor device according to claim 1, wherein a thickness of said interconnection is greater than or equal to 2 μm and less than or equal to 10 μm.

9. The method for manufacturing a silicon carbide semiconductor device according to claim 1, wherein said step of forming an interconnection further includes the step of forming a second metal layer being in contact with said first metal layer and being constituted of titanium nitride or titanium tungsten.

10. A silicon carbide semiconductor device, comprising:
a silicon carbide substrate having a first main surface and a second main surface opposite to each other and including a first conductive type region provided in contact with said first main surface;
a gate insulating film being in contact with said first main surface of said silicon carbide substrate;
a gate electrode being in contact with said gate insulating film;
an interlayer insulating film being in contact with said gate electrode and said gate insulating film;
a first recess being formed so as to have a width that increases with distance from said first main surface and being provided with a first inner wall surface formed with said interlayer insulating film;
a second recess being in connection with said first recess and having a second inner wall surface formed with said interlayer insulating film and said gate insulating film;
a first electrode being arranged in said second recess and being in contact with said first conductivity type region; and
a first interconnection being arranged in contact with said first inner wall surface and said second inner wall surface and being electrically connected to said first electrode, and
wherein the gate insulating film is exposed to the second inner wall surface, and
wherein said first interconnection has a first metal layer including titanium being in contact with said second inner wall surface and being separated from said first inner wall surface.

11. The silicon carbide semiconductor device according to claim 10, wherein a portion surrounding a circumferential corner portion of said gate electrode in an upper surface of said interlayer insulating film has more roundness than said circumferential corner portion of said gate electrode.

12. The silicon carbide semiconductor device according to claim 10, further comprising:
a third recess being formed in said interlayer insulating film arranged on said gate electrode and having a third inner wall surface formed so as to have a width that increases with distance from said first main surface;
a fourth recess being in connection with said third recess and having a fourth inner wall surface being formed with said interlayer insulating film; and
a second interconnection being arranged in contact with said third inner wall surface and said fourth inner wall surface, and being electrically connected to said gate electrode.

13. The silicon carbide semiconductor device according to claim 10, wherein said interlayer insulating film includes a first insulating film being in contact with said gate electrode and not being doped with impurities, and a second insulating film covering said first insulating film, having a lower softening point than said first insulating film, and being doped with impurities.

14. The silicon carbide semiconductor device according to claim 13, wherein said interlayer insulating film further includes a third insulating film covering said second insulating film and being constituted of silicon dioxide.

15. The silicon carbide semiconductor device according to claim 10, wherein said first interconnection has a thickness greater than or equal to 2 μm and less than or equal to 10 μm.

16. The silicon carbide semiconductor device according to claim 10, wherein said first interconnection further includes a second metal layer being in contact with said first metal layer and being constituted of titanium nitride or titanium tungsten.

\* \* \* \* \*